US010186482B2

(12) United States Patent
Bao et al.

(10) Patent No.: US 10,186,482 B2
(45) Date of Patent: Jan. 22, 2019

(54) SELF ALIGNED VIA FUSE

(71) Applicant: GLOBALFOUNDRIES INC., Grand Cayman (KY)

(72) Inventors: Junjing Bao, San Diego, CA (US); Samuel S. Choi, Hopewell Junction, NY (US); Wai-kin Li, Winksele (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/975,726

(22) Filed: Dec. 19, 2015

(65) Prior Publication Data
US 2016/0104677 A1 Apr. 14, 2016

Related U.S. Application Data

(62) Division of application No. 13/968,467, filed on Aug. 16, 2013, now Pat. No. 9,240,376.

(51) Int. Cl.
*H01L 23/525* (2006.01)
*H01L 23/528* (2006.01)
*H01L 21/768* (2006.01)
*H01L 21/311* (2006.01)

(52) U.S. Cl.
CPC .... *H01L 23/5256* (2013.01); *H01L 21/31144* (2013.01); *H01L 21/768* (2013.01); *H01L 21/76802* (2013.01); *H01L 21/76811* (2013.01); *H01L 21/76816* (2013.01); *H01L 2924/0002* (2013.01)

(58) Field of Classification Search
CPC .......... H01L 23/5256; H01L 21/31–21/32155; H01L 21/768–21/76898; H01L 23/5526; H01L 23/525–23/5258; H01L 28/20–28/26
See application file for complete search history.

(56) References Cited

U.S. PATENT DOCUMENTS

| 5,316,978 A | * | 5/1994 | Boyd | H01L 28/20 148/DIG. 136 |
| 6,033,939 A | * | 3/2000 | Agarwala | H01L 23/5258 257/E23.15 |
| 6,040,615 A | * | 3/2000 | Nagai | H01L 23/5258 257/173 |

(Continued)

OTHER PUBLICATIONS

Lin et al., "Electromigration study of copper lines on steps prepared by a plasma base etch process", J. App. Phys., Mar. 2012 pp. 064909-1 to 064909-6, vol. 111.

*Primary Examiner* — Eric A. Ward
(74) *Attorney, Agent, or Firm* — Scully Scott Murphy and Presser; Frank Digiglio

(57) ABSTRACT

A method including forming a first via opening in a substrate, the first via opening is self-aligned to a first trench in the substrate, forming a second via opening in the substrate, the second via opening is self-aligned to a second trench in the substrate, a portion of the second via opening overlaps a portion of the first via opening to form an overlap region, and the overlap region having a width (w) equal to or greater than a space (s) between the first trench and the second trench, and removing a portion of the substrate in the overlap region to form a bridge opening, the bridge opening is adjacent to the first and second via openings and extends between the first and second trenches.

20 Claims, 30 Drawing Sheets

(56) References Cited

U.S. PATENT DOCUMENTS

| | | | |
|---|---|---|---|
| 6,215,173 B1 * | 4/2001 | Echigoya | H01L 23/5258 257/209 |
| 6,255,144 B1 * | 7/2001 | Jeon | H01L 23/5258 257/E23.15 |
| 6,261,873 B1 * | 7/2001 | Bouldin | H01L 23/5258 257/E23.15 |
| 6,444,503 B1 * | 9/2002 | Yu | H01L 23/5256 257/E23.149 |
| 6,555,458 B1 * | 4/2003 | Yu | H01L 23/5256 257/E23.149 |
| 6,566,242 B1 | 5/2003 | Adams et al. | |
| 6,667,533 B2 * | 12/2003 | Daubenspeck | H01L 23/5256 257/296 |
| 6,720,249 B1 | 4/2004 | Dalton et al. | |
| 6,873,027 B2 | 3/2005 | Dalton et al. | |
| 6,899,796 B2 * | 5/2005 | Wang | C23C 14/046 204/192.15 |
| 6,984,294 B2 * | 1/2006 | Friedemann | C23C 14/34 204/192.12 |
| 7,371,461 B2 | 5/2008 | Fuller et al. | |
| 7,460,003 B2 | 12/2008 | Hsu et al. | |
| 7,576,408 B2 * | 8/2009 | Byun | G11C 17/143 257/209 |
| 7,781,892 B2 * | 8/2010 | Chen | H01L 23/485 257/758 |
| 2009/0283853 A1 | 11/2009 | Huebinger | |
| 2010/0096722 A1 | 4/2010 | Kim et al. | |
| 2011/0076845 A1 | 3/2011 | Tsai et al. | |
| 2012/0012976 A1 | 1/2012 | Gambino et al. | |
| 2012/0261793 A1 | 10/2012 | Yang et al. | |
| 2012/0326269 A1 | 12/2012 | Bonilla et al. | |
| 2014/0246704 A1 * | 9/2014 | Yamada | H01L 27/0248 257/209 |
| 2014/0332871 A1 | 11/2014 | Kim et al. | |
| 2017/0053960 A1 * | 2/2017 | Wakiyama | H01L 23/3192 |

* cited by examiner

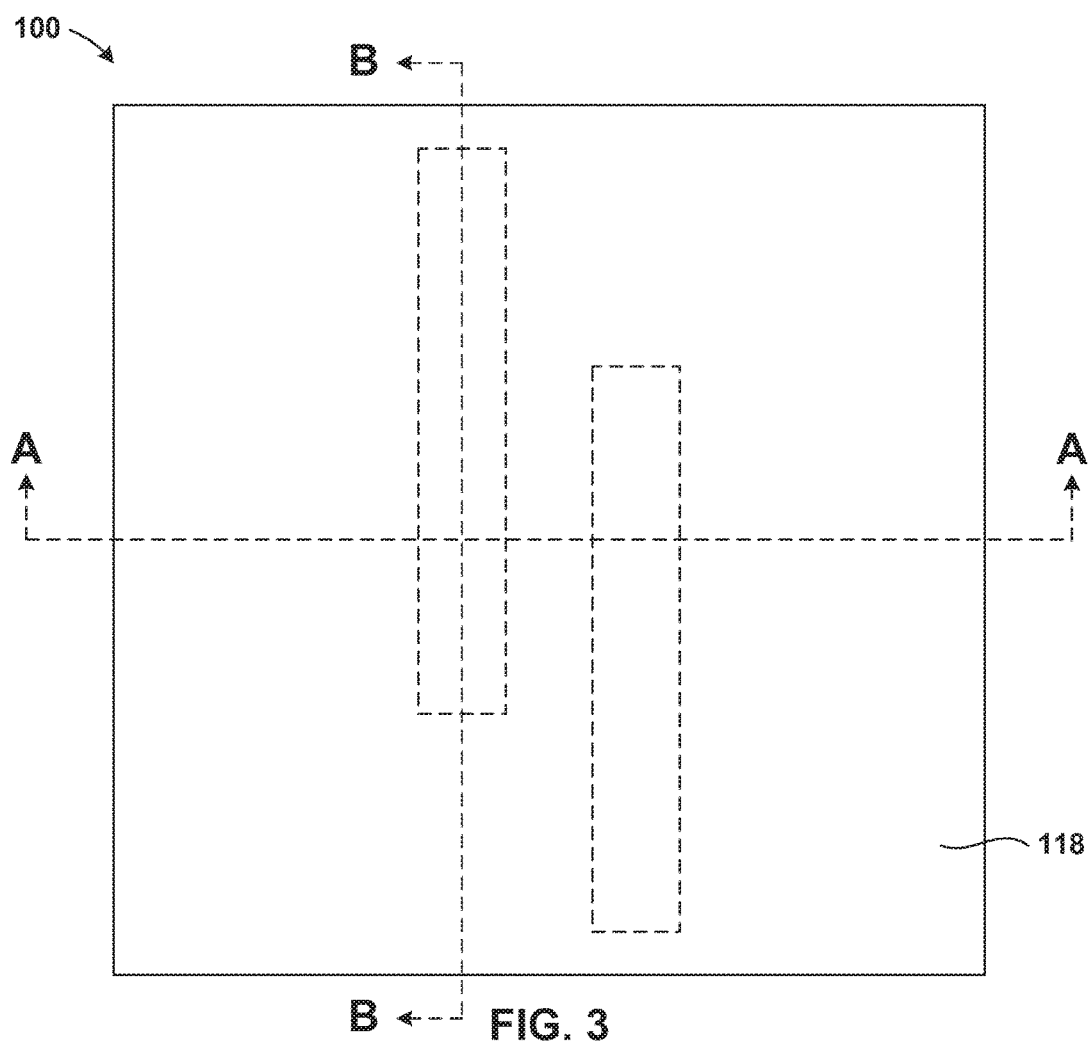

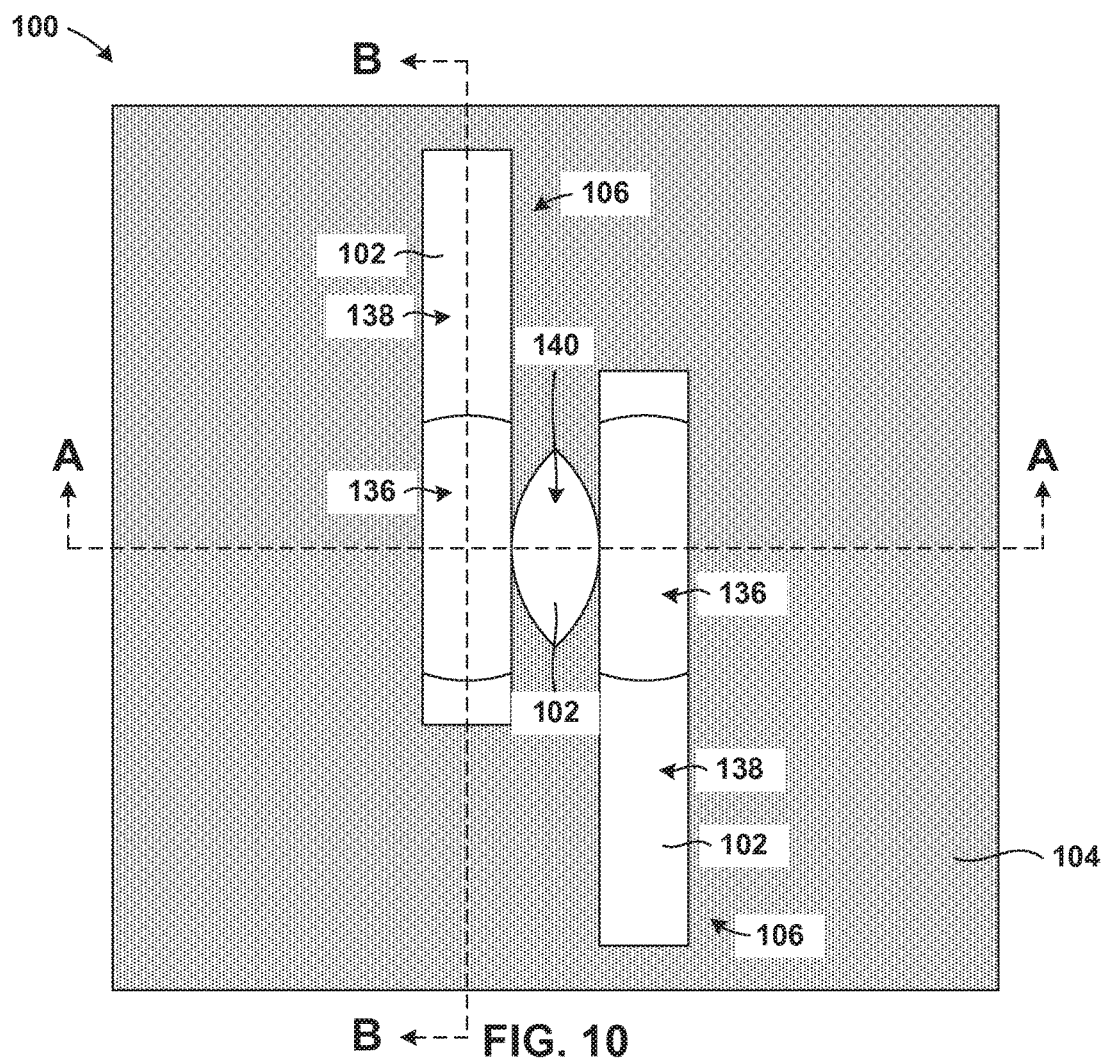

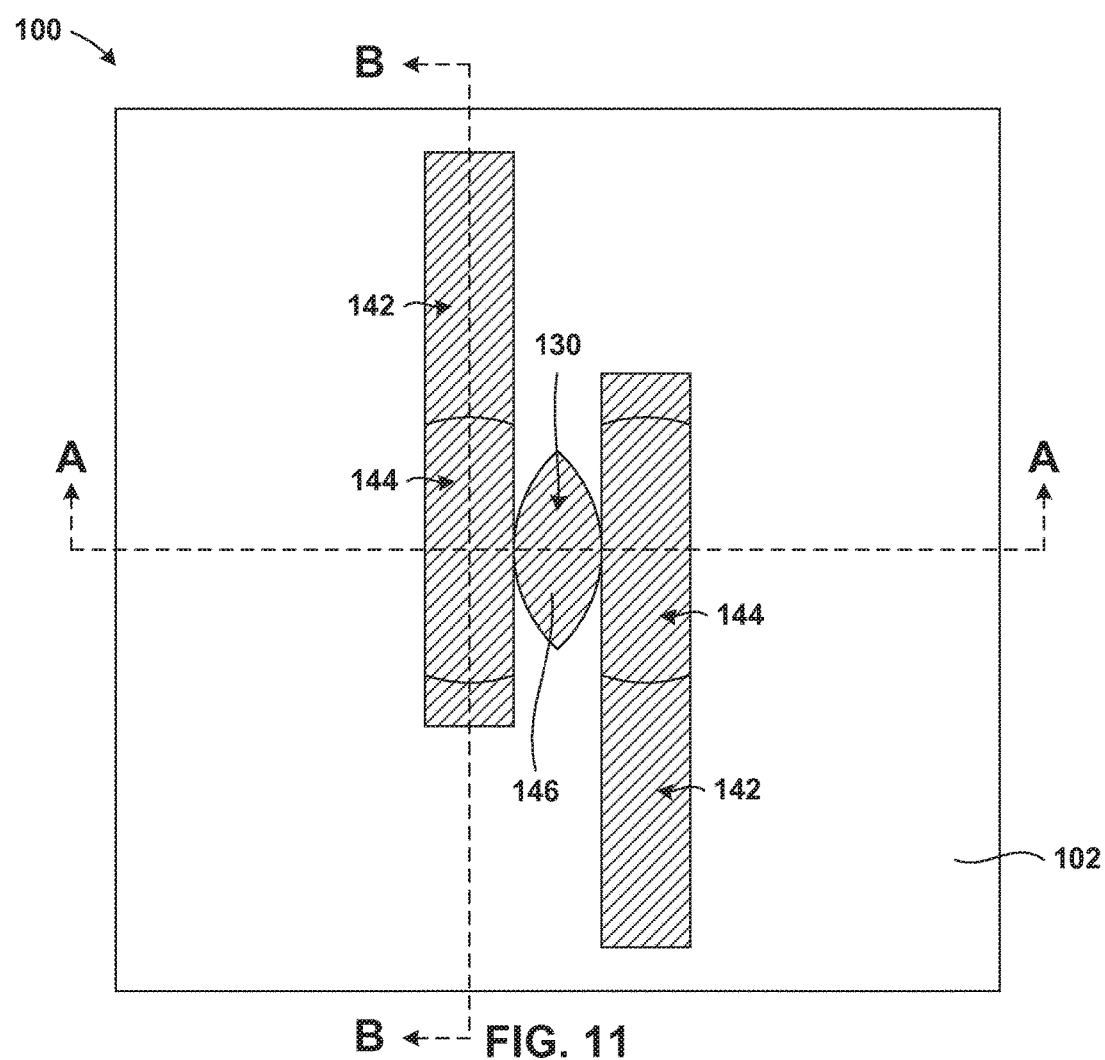

SELF ALIGNED VIA FUSE

CROSS REFERENCE TO RELATED APPLICATION

This application is a divisional of U.S. patent application Ser. No. 13/968,467, filed Aug. 16, 2013 the entire content and disclosure of which is incorporated herein by reference.

BACKGROUND

The present invention generally relates to semiconductor device manufacturing, and more particularly to a technique for forming an electronic fuse using a self-aligned via process flow.

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. For example, electromigration can be defined as the transport of material caused by the gradual movement of ions in a conductor due to the momentum transfer between conducting electrons and diffusing metal atoms. In e-fuses that take advantage of electromigration effect, such transport of material caused by the gradual movement of ions can produce voids which cause the e-fuse to blow and create the open circuit.

SUMMARY

According to one exemplary embodiment of the present invention, a method is provided. The method may include forming a first via opening in a substrate, the first via opening is self-aligned to a first trench in the substrate, forming a second via opening in the substrate, the second via opening is self-aligned to a second trench in the substrate, a portion of the second via opening overlaps a portion of the first via opening to form an overlap region, and the overlap region having a width (w) equal to or greater than a space (s) between the first trench and the second trench, and removing a portion of the substrate in the overlap region to form a bridge opening, the bridge opening is adjacent to the first and second via openings and extends between the first and second trenches.

According to another exemplary embodiment of the present invention, a method is provided. The method may include forming a first hardmask layer above a substrate, forming a trench pattern in the first hardmask layer, the trench pattern having at least two trench features, and forming a second hardmask layer above the first hardmask layer. The method may further include forming a patterning layer above the second hardmask layer, forming a first via pattern and a second via pattern in the patterning layer, the first via pattern being aligned above one trench feature and the second via pattern being aligned above the other trench feature, a portion of the first via pattern overlapping a portion of the second via pattern to form an overlap region, and forming an overlap pattern in the second hardmask layer, the overlap pattern is defined by the overlap region of the first and second via patterns, the overlap pattern having a width (w) equal to or greater than a space (s) between the two trench features. The method may further include transferring the first via pattern and the second via pattern from the patterning layer into the substrate resulting in a first self-aligned via opening and a second self-aligned via opening, the first via pattern is self-aligned to one of the trench features and the second self-aligned via opening is self-aligned to the other trench feature, transferring the trench pattern from the first hardmask layer into the substrate resulting in at least two trench openings, and transferring the overlap pattern into the substrate to form a bridge opening, the bridge opening is adjacent to the first self-aligned via opening and the second self-aligned via opening, and extends from one trench opening to the other trench opening.

According to another exemplary embodiment of the present invention, a structure is provided. The structure may include a first metal line adjacent to a second metal line, the first and second metal lines being in the same metal level, a first via self-aligned to the first metal line, a second via self-aligned to the second metal, and a conductive bridge extending from the first metal line to the second metal line, the conductive bridge is adjacent to both the first via and the second via, and a vertical thickness of the conductive bridge is less than a vertical thickness of either the first metal line or the second metal line.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

FIG. 3 is a top view of the structure and illustrates depositing a first planarization layer, a second hardmask layer, a patterning layer, a second planarization layer, and a first anti-reflective coating layer according to an exemplary embodiment.

FIG. 10 is a top view of the structure and illustrates transferring the trench pattern from the first hardmask layer into the underlying substrate according to an exemplary embodiment.

FIG. 11 is a top view of the structure and illustrates forming the final structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
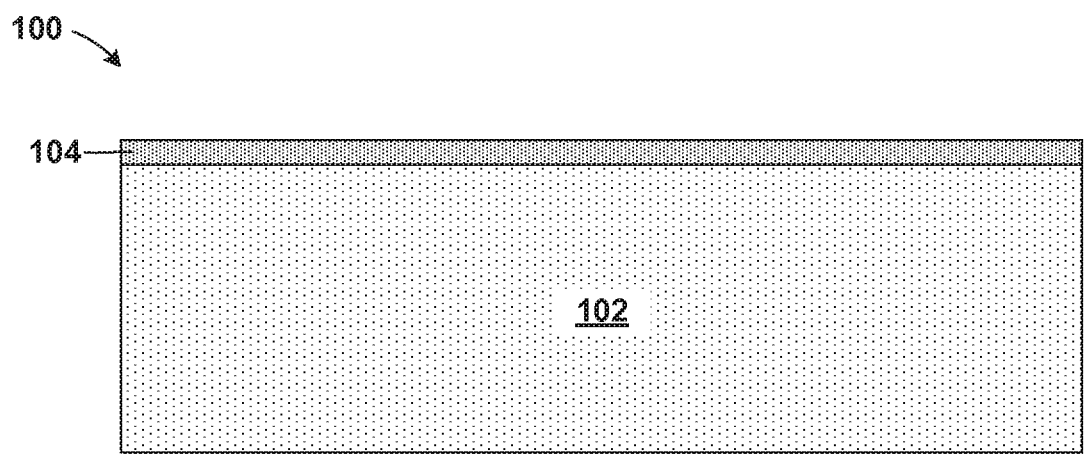
FIG. 1 is a cross-sectional view of a structure at an intermediate step of fabrication according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to a technique for forming an electronic fuse (e-fuse) using a self-aligned via process flow. The e-fuse structure may include a conductive bridge between two adjacent metal lines of the same metal level.

Advantageously, the formation of the e-fuse structure according to the present disclosure can be implemented in the back-end-of-line (BEOL), and is compatible with current process flows. The present invention thus allows the e-fuse to be fabricated during normal interconnect process flows, thus advantageously reducing processing costs for manufacturing e-fuses which are normally fabricated in different process flows.

Ideally, low programming currents and short programming times are preferable when programming an e-fuse. One way to fabricate an e-fuse with low programming currents and short programming times may include forming a conductive bridge between two adjacent metal lines of the same metal level. The metal bridge may experience increase current density and heating, and thereby encourage faster e-fuse programming at lower currents. One embodiment by which to improve e-fuse programming by forming the conductive bridge is described in detail below by referring to the accompanying drawings FIGS. 1-9. In the present embodiment, a conductive bridge may be formed by overlapping two vias between two adjacent metal lines of the same metal level in a self-aligned via process flow.

FIG. 1 is a demonstrative illustration of a structure during an intermediate step of a method of fabricating an e-fuse using a self-aligned via (SAV) process flow according to one embodiment. More specifically, the method can start with providing a first hardmask layer 104 above a substrate 102 in which the e-fuse is to be formed.

In one embodiment, the substrate 102 can be any dielectric materials suitable for BEOL or middle-of-line (MOL) interconnect structures. The substrate 102 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, plasma enhanced chemical vapor deposition, spin on deposition, or physical vapor deposition may be used to form the substrate 102. The substrate 102 may have a typical thickness ranging from about 100 nm to about 150 nm and ranges there between, although a thickness less than 100 nm and greater than 150 nm may be acceptable. It should be noted that substrate 102 may represent a single interconnect level, of multiple interconnect levels, within the BEOL of the structure 100.

In an alternative embodiment the substrate 102 can be any gate materials suitable for FEOL structures. In other embodiments, the substrate 102 can be a semiconductor material or a dielectric material on top of a semiconductor material. The first hardmask layer 104 can include, for example, titanium-nitride (TiN), titanium anti-reflective coating (TiARC), hafnium anti-reflective coating (hfARC), amorphous carbon (a-C), carbon (a-Si), or NBlock and can have a thickness, in some embodiments, ranging from about 10 nm to about 70 nm, and ranges there between.

Figure 2:
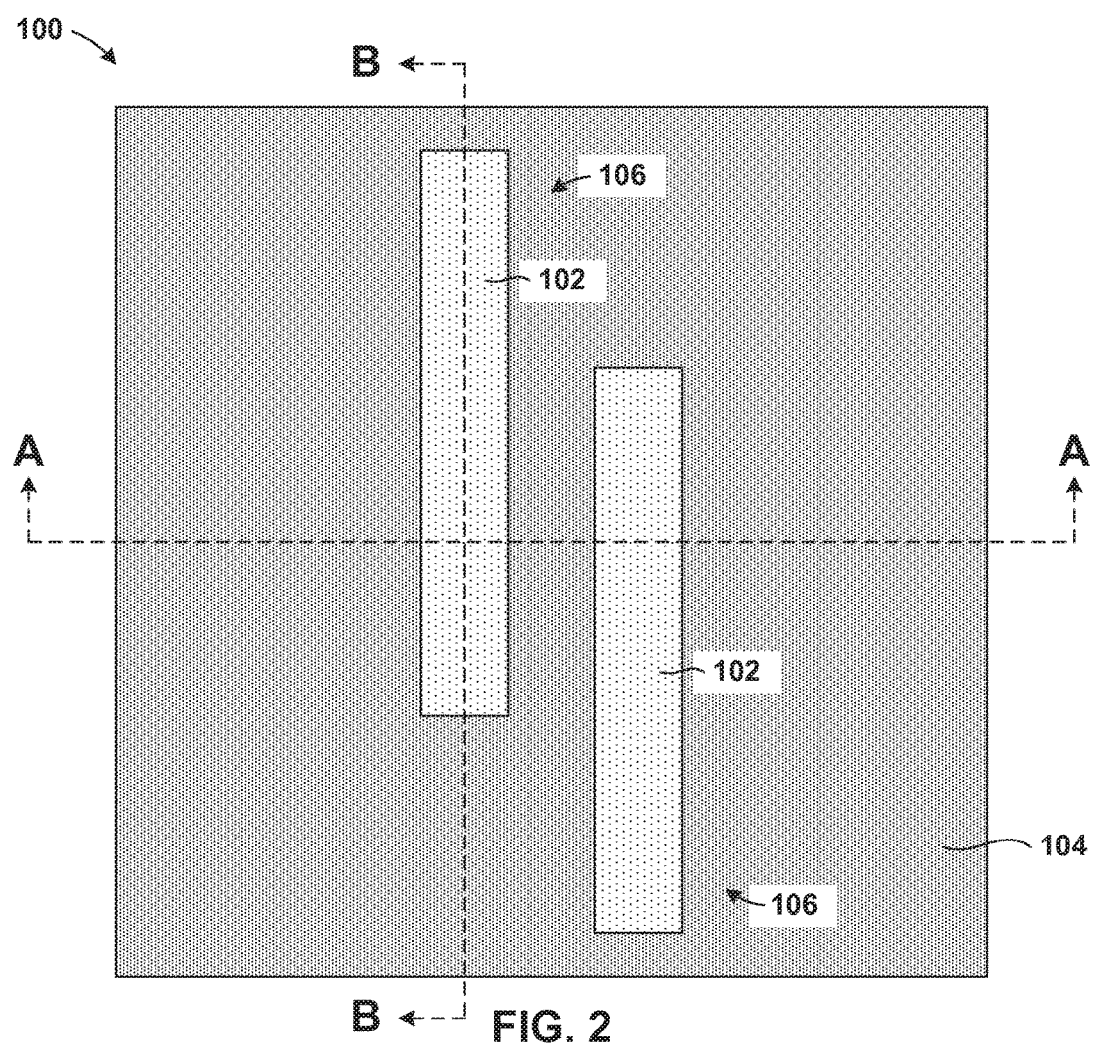
FIG. 2 is a top view of the structure and illustrates forming a trench pattern in a first hardmask layer according to an exemplary embodiment.
Figure 2A:
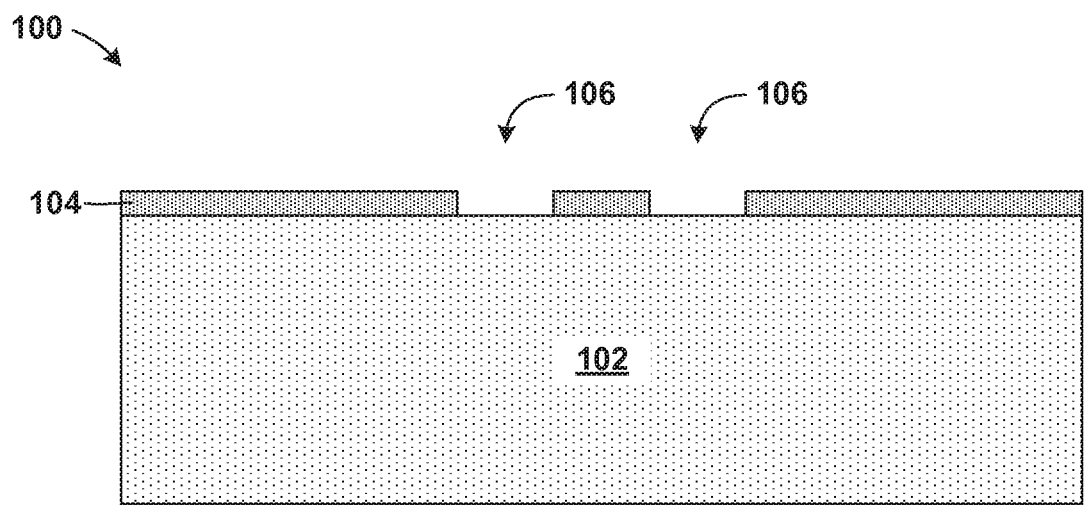
FIG. 2A is a cross section view of FIG. 2, taken along section line A-A.
Figure 2B:
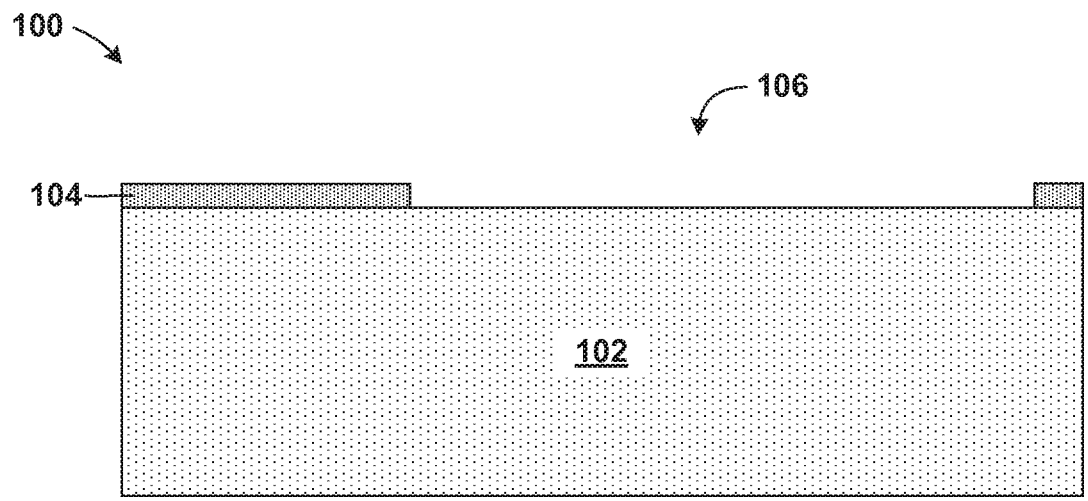
FIG. 2B is a cross section view of FIG. 2, taken along section line B-B.

FIGS. 2, 2A, and 2B are a demonstrative illustration of the structure during an intermediate step of a method of fabricating an e-fuse using a self-aligned via (SAV) process flow according to one embodiment. More specifically, the method can start with forming a trench pattern 106 in the first hardmask layer 104 above the substrate 102. FIG. 2 illustrates the structure 100 from a top view. FIG. 2A is a cross section view of FIG. 2 taken along section line A-A. FIG. 2B is a cross section view of FIG. 2 taken along section line B-B. Therefore, FIG. 2A is a cross sectional view perpendicular to the length of the trenches of the trench pattern 106, and FIG. 2B is a cross sectional view parallel to the length of the trenches of the trench pattern 106. The trench pattern 106 may be transferred into the first hardmask layer 104 using, for example, known photolithography image transfer techniques. Any other method known in the art can be used to form the trench pattern 106 in the first hardmask layer 104.

The trench pattern 106 may include one or more trench features, as illustrated in the figures. It should be noted that the trench features of the trench pattern 106 will subsequently be used to form metal lines. In general, the trench pattern 106, of the present embodiment, may include two adjacent trench features used to form a single e-fuse between two adjacent metal lines of the same metal level. In one embodiment, the trench pattern 106 may include multiple trench features to form multiple e-fuses. Because a single e-fuse may be fabricated between two adjacent metal lines of the same metal level, it is conceivable that two e-fuses may be fabricated with a trench pattern having only three trench features. In such cases, both e-fuses would share one metal line, and thus the space between the two e-fuses will be limited by feature size in at least one direction. It may also be conceivable to fabricate two e-fuses with a trench pattern having four trench features. In such cases, the space between the two e-fuses is not limited in any direction. For example, see FIGS. 10 and 11. It should be noted that the trench pattern 106 may also include one or more trench features unrelated to the fabrication of the e-fuse of the present embodiment.

The dimensions of any one trench feature may generally refer to the width and the length, the width generally being the smaller dimension of the two. Furthermore, any one trench feature of the trench pattern 106 may have any width and length suitable for its intended application; however the width and length is not critical to the present embodiment.

Figure 3A:
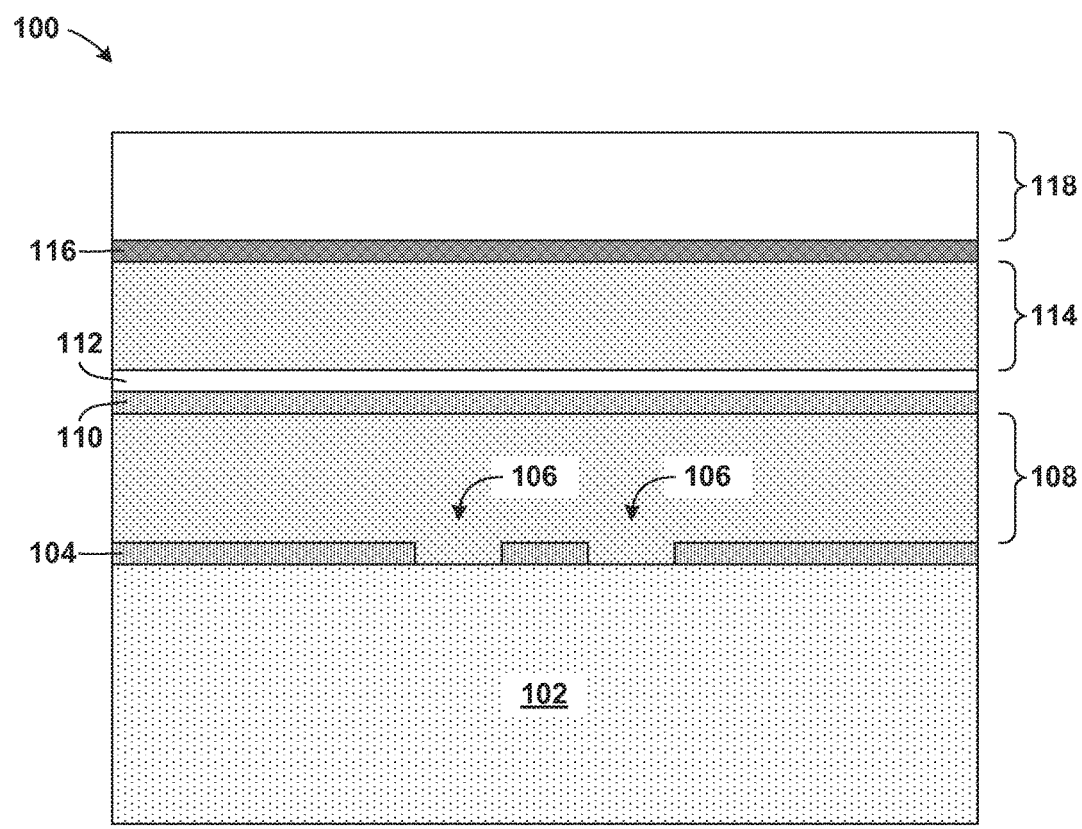
FIG. 3A is a cross section view of FIG. 3, taken along section line A-A.
Figure 3B:
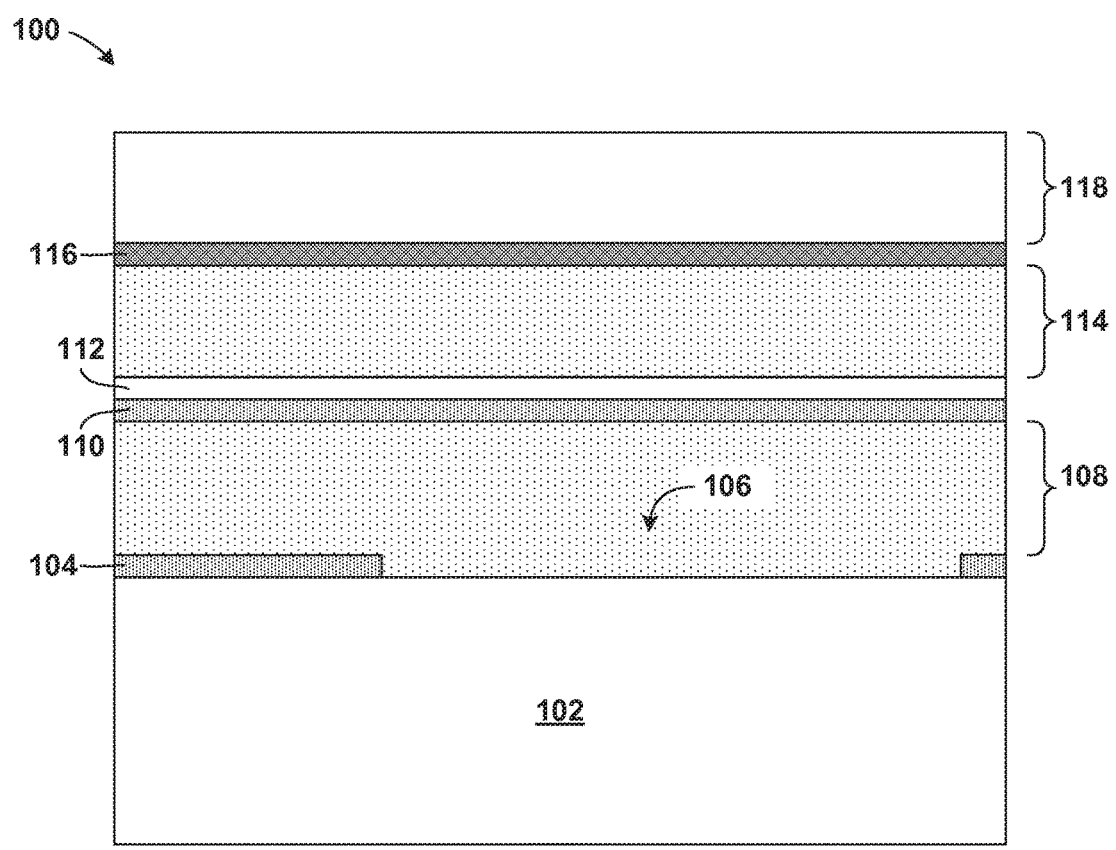
FIG. 3B is a cross section view of FIG. 3, taken along section line B-B.

FIGS. 3, 3A, and 3B are a demonstrative illustration of the structure during an intermediate step of a method of fabricating an e-fuse using a self-aligned via (SAV) process flow according to one embodiment. More specifically, the method can include depositing a first planarization layer 108, a second hardmask layer 110, a patterning layer 112, a second planarization layer 114, and a first anti-reflective coating layer 116 (hereinafter "ARC" layer) on top of one another and in sequence above the first hardmask layer 104 and above the substrate 102. FIG. 3 illustrates the structure 100 from a top view. FIG. 3A is a cross section view of FIG. 3 taken along section line A-A. FIG. 3B is a cross section view of FIG. 3 taken along section line B-B. It should be noted that the trench pattern 106 may hereinafter be hidden from most top views, and as such is represented by dashed lines to improve clarity and understanding.

The first planarization layer 108, and the second planarization layer 114 can be an organic planarization layer (OPL) or a layer of material that is capable of being planarized by known chemical mechanical polishing techniques. In one embodiment, for example, both the first planarization layer 108 and second planarization layer 114 can be an amorphous carbon layer able to withstand the high process temperatures of subsequent processing steps. The first planarization layer 108, and second planarization layer 114 can preferably have a thickness ranging from about 10 nm to about 300 nm, and ranges there between. The second hardmask layer 110 may be substantially similar to the first hardmask layer 104, described above. The patterning layer 112 can include silicon oxide and can be formed, for example, from a tetraethyl orthosilicate (TEOS) precursor to have a thickness, in some embodiments, ranging from about 10 nanometers (nm) to about 100 nm, and ranges there between. The first ARC layer 116 can include silicon (Si) and in some embodiments can be referred to as a SiARC layer or a bottom anti-reflective coating layer (BARC). In some embodiments, the first ARC layer 116 can have a thickness ranging from about 10 nm to about 100 nm, and ranges there between.

Figure 4:
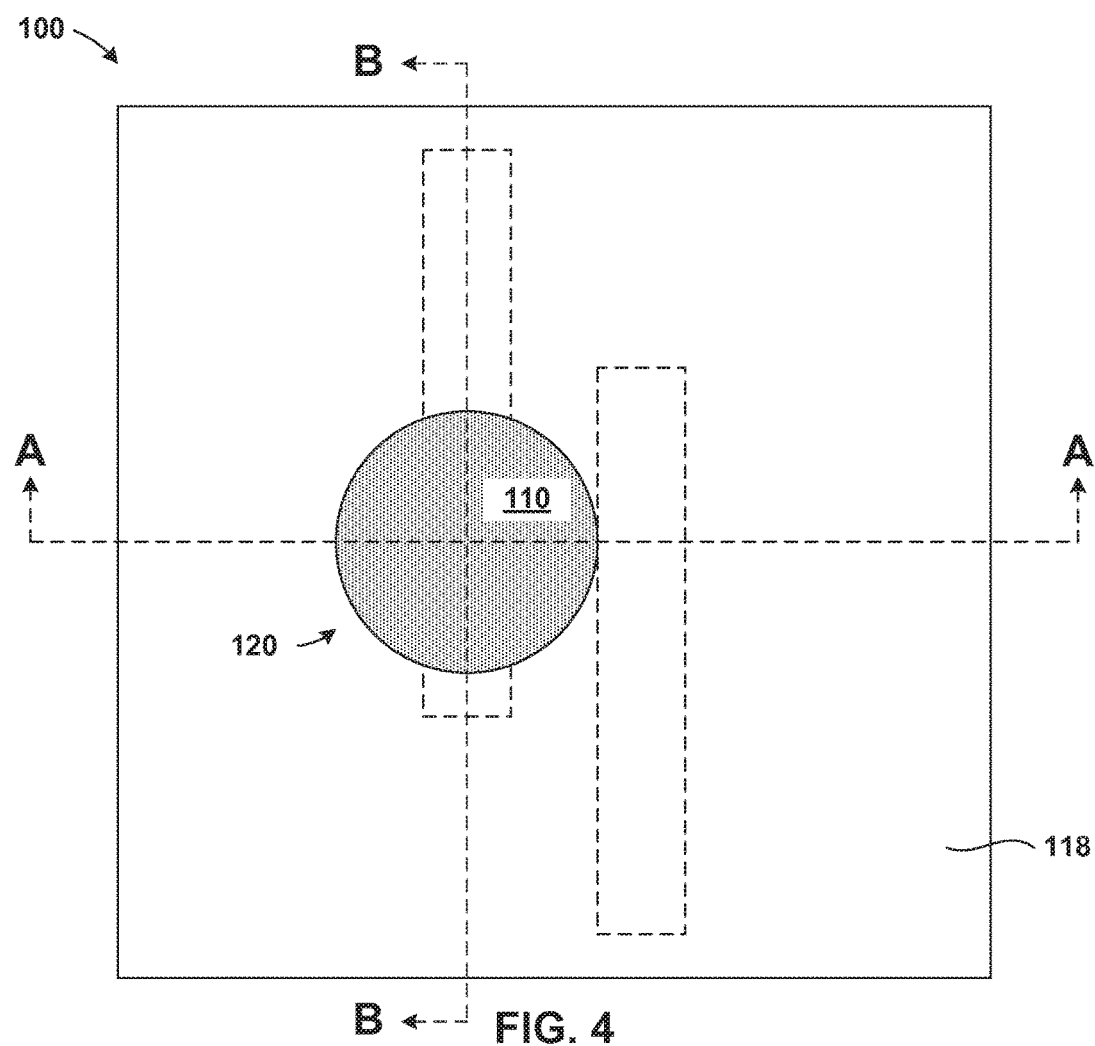
FIG. 4 is a top view of the structure and illustrates forming a first via pattern in the first ARC layer, the second planarization layer, and the pattering layer according to an exemplary embodiment.
Figure 4A:
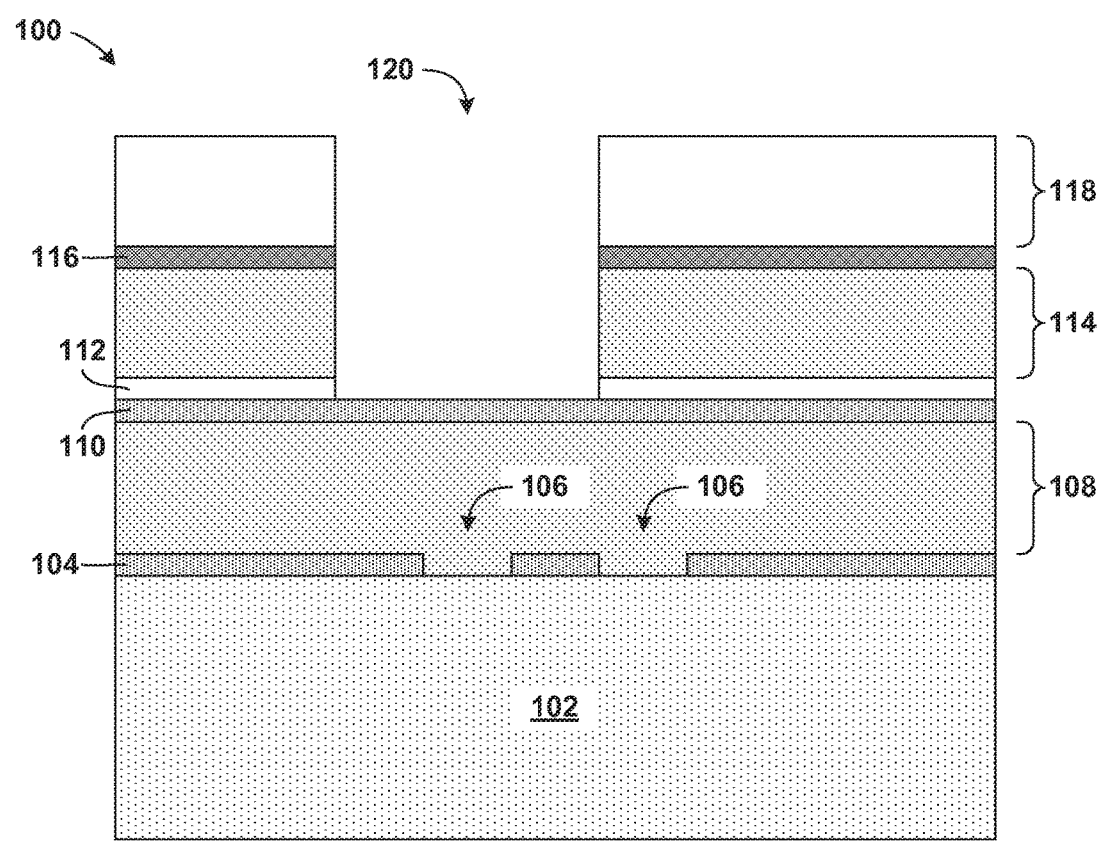
FIG. 4A is a cross section view of FIG. 4, taken along section line A-A.
Figure 4B:
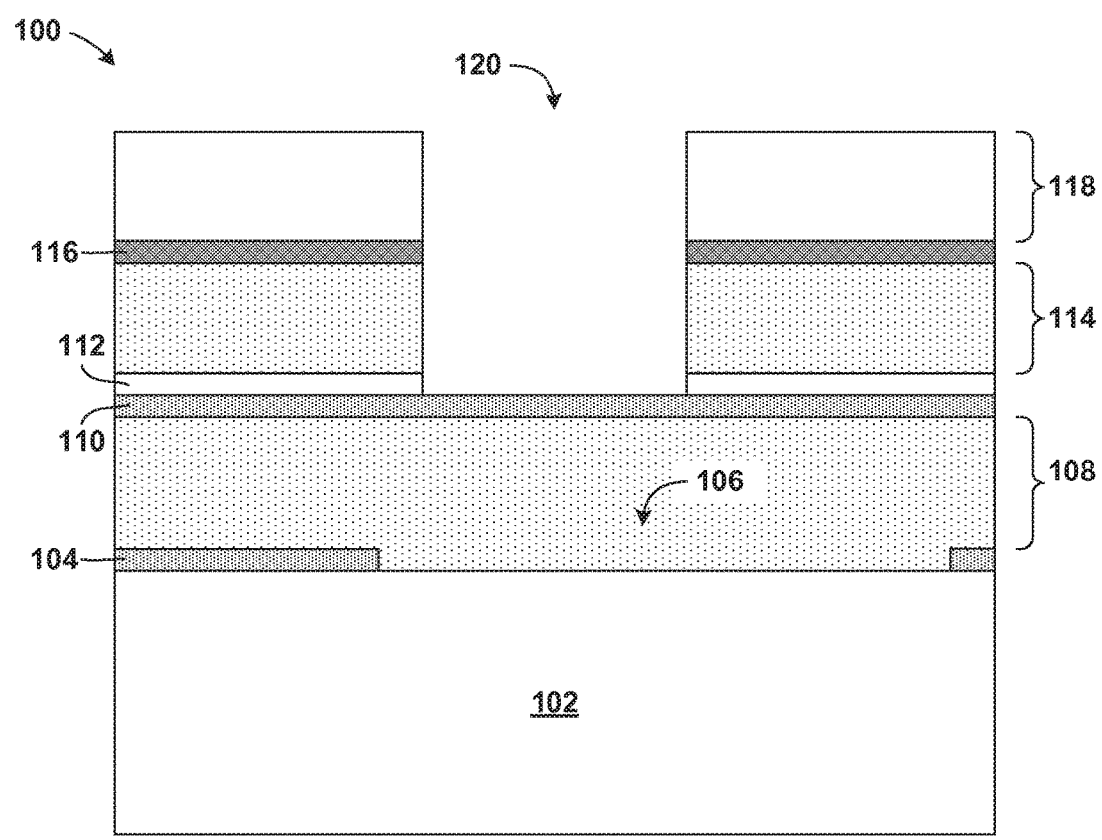
FIG. 4B is a cross section view of FIG. 4, taken along section line B-B.

FIGS. 4, 4A, and 4B are a demonstrative illustration of the structure during an intermediate step of a method of fabricating an e-fuse using a self-aligned via (SAV) process flow according to one embodiment. More specifically, the method can include a first stage of a double patterning technique in which a first via pattern 120 can be transferred into the second planarization layer 114 and the first ARC layer 116. FIG. 4 illustrates the structure 100 from a top view. FIG. 4A is a cross section view of FIG. 4 taken along section line A-A. FIG. 4B is a cross section view of FIG. 4 taken along section line B-B.

The first via pattern 120 may generally include one via feature per e-fuse; however, it is conceivable to simultaneously fabricate multiple e-fuses, and thus fabricate a first via pattern having multiple via features. Furthermore, it should be noted that the first via pattern 120 may also include one or more via features unrelated to the fabrication of the e-fuse of the present embodiment. The via feature of the first via pattern 120 may have a width or diameter ranging from about 60 nm to about 100 nm, and ranges there between. In general, the first via pattern 120 may be positioned or aligned above one of the trench features of the trench pattern 106.

During this step, a first photo-resist layer 118 can be formed on top of the first ARC layer 116. The first photo-resist layer 118 can include any suitable photo-resist material known in the art. The particular photo-resist material chosen can partly depend upon the desired pattern to be formed and the exposure method used. In one embodiment, the first photo-resist layer 118 can include a single exposure resist suitable for, for example, argon fluoride (ArF); a double exposure resist suitable for, for example, a thermal cure system; or an extreme ultraviolet (EUV) resist suitable for, for example, an optical process. In one embodiment, the first photo-resist layer 118 can be formed with a thickness ranging from about 30 nm to about 150 nm, and ranges there between. The first photo-resist layer 118 can then be lithographically exposed and developed to create the first via pattern 120. The first via pattern 120 can be formed by applying any appropriate photo-exposure method suitable to the type of photo-resist layer being used, as is well known in the art.

More specifically, the first via pattern 120 can be transferred from the first photo-resist layer 118 into underlying layers, for example, the first ARC layer 116 and the second planarization layer 114. Transferring of the first via pattern 120 in the present step can be performed by etching the first ARC layer 116, the second planarization layer 114, and the patterning layer 112 selective to the second hardmask layer 110. A directional etching technique such as a reactive-ion-etching technique can be used to etch the first ARC layer 116, the second planarization layer 114, and the patterning layer 112. In one embodiment, the first ARC layer 116 can be etched with a reactive-ion-etching technique using a fluorocarbon based etchant and the second planarization layer 114 can be etched with a reactive-ion-etching technique using an oxygen based etchant.

In the present step, the first photoresist layer 118 can function as a mask during etching of the first ARC layer 116, and can be removed during etching of the second planarization layer 114. In this instance, the first ARC layer 116 can function as a mask during etching of the second planarization layer 114. Further, the patterning layer 112 can function as an etch-stop layer during etching of the second planarization layer 114.

After transferring the first via pattern 120 into the first ARC layer 120, and the second planarization layer 118 the first via pattern 120 can be transferred into the patterning layer 112. Transferring the first via pattern 120 in the present step can be performed by etching the patterning layer 112 selective to the second hardmask layer 110. A directional etching technique such as a reactive-ion-etching technique can be used to etch the patterning layer 112. In one embodiment, the patterning layer 112 can be etched with a reactive-ion-etching technique using a fluorocarbon based etchant. In the present step, the second planarization layer 114 can function as a mask and the first ARC layer 116 can be thinned or removed during etching of the patterning layer 112. Further, the hardmask layer 110 can function as an etch-stop layer during the etching of the patterning layer 112.

Thereafter, the second planarization layer 114 can be removed or lifted off. The second planarization layer 114 can be stripped or removed with either a wet clean technique, for example SP clean, or with a plasma etching technique using an oxygen based plasma.

Figure 5:
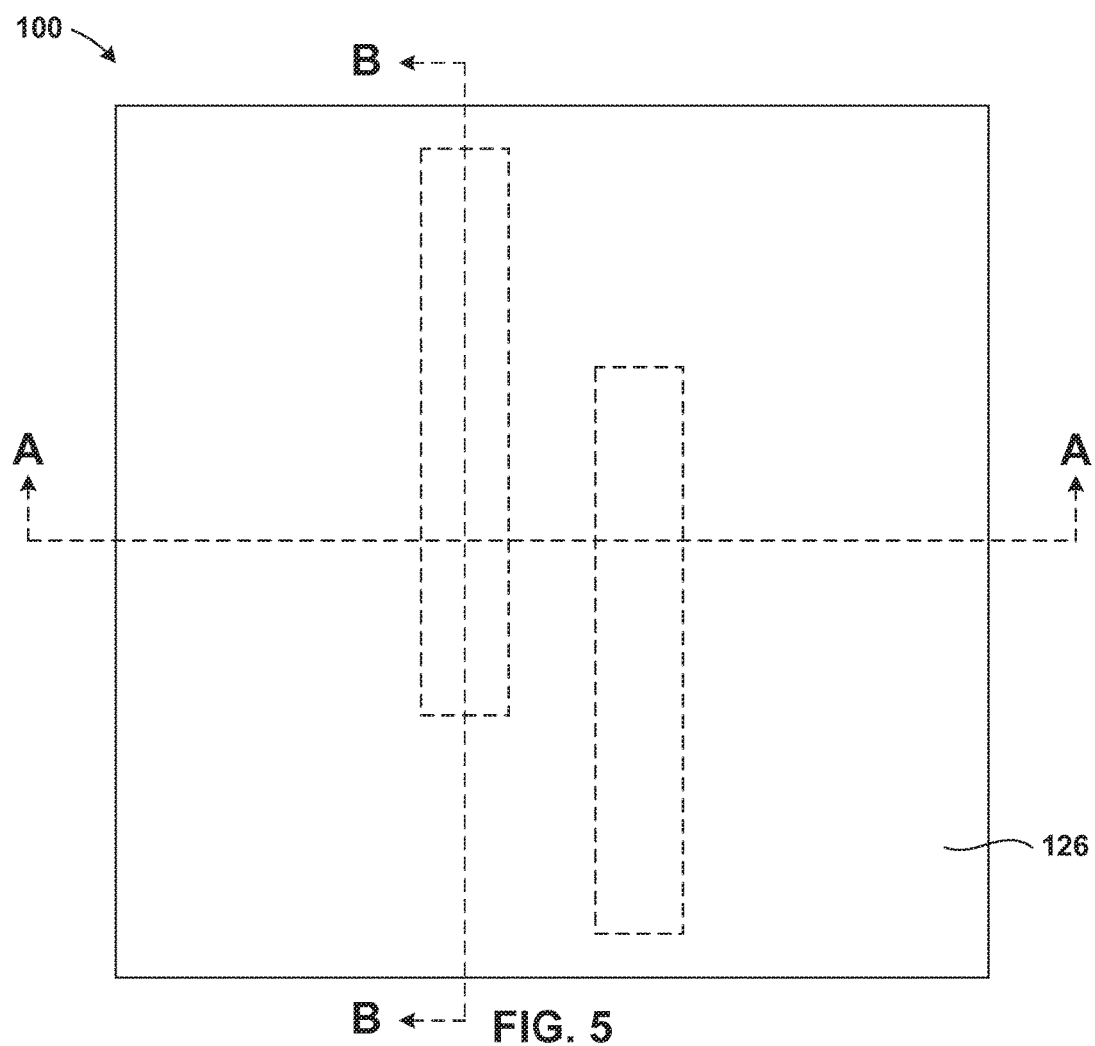
FIG. 5 is a top view of the structure and illustrates depositing a third planarization layer and a second anti-reflective coating layer according to an exemplary embodiment.
Figure 5A:
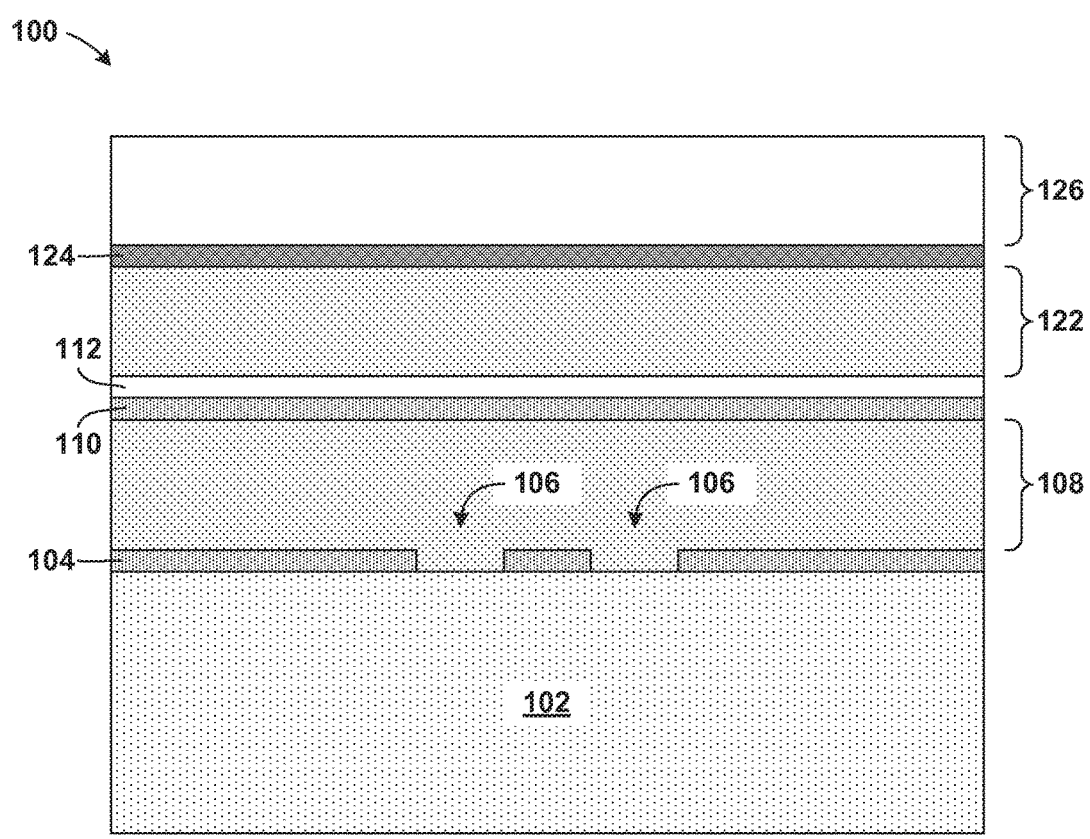
FIG. 5A is a cross section view of FIG. 5, taken along section line A-A.
Figure 5B:
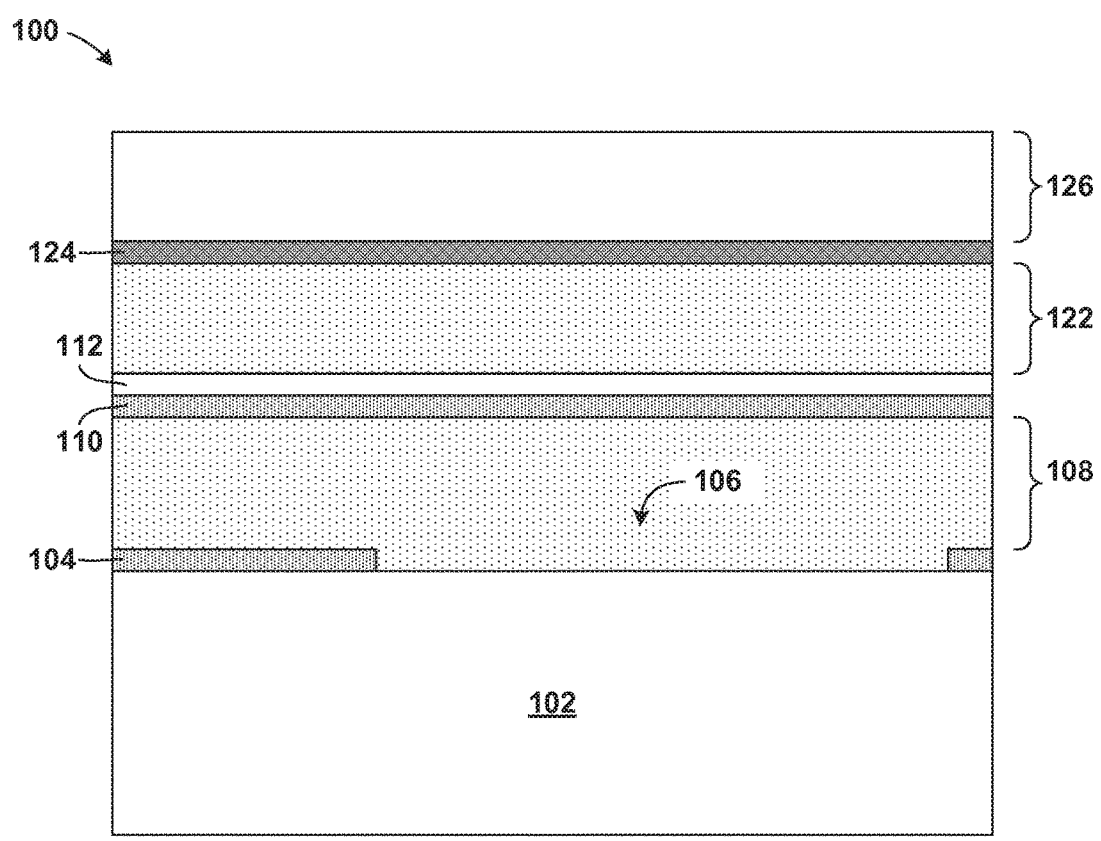
FIG. 5B is a cross section view of FIG. 5, taken along section line B-B.

FIGS. 5, 5A, and 5B are a demonstrative illustration of the structure during an intermediate step of a method of fabricating an e-fuse using a self-aligned via (SAV) process flow according to one embodiment. More specifically, the method can include depositing a third planarization layer 122 and a second ARC layer 124. FIG. 5 illustrates the structure 100 from a top view. FIG. 5A is a cross section view of FIG. 5 taken along section line A-A. FIG. 5B is a cross section view of FIG. 5 taken along section line B-B.

After removing the second planarization layer 114 selective to the patterning layer 112 and the second hardmask layer 110, the third planarization layer 122 and the second ARC layer 124 can be formed on top of one another and in sequence above the patterning layer 112. The third planarization layer 122 and the second ARC layer 124 may be substantially similar to the first planarization layer 108 (FIG. 4) and the first ARC layer 116 (FIG. 4) described above.

Figure 6:
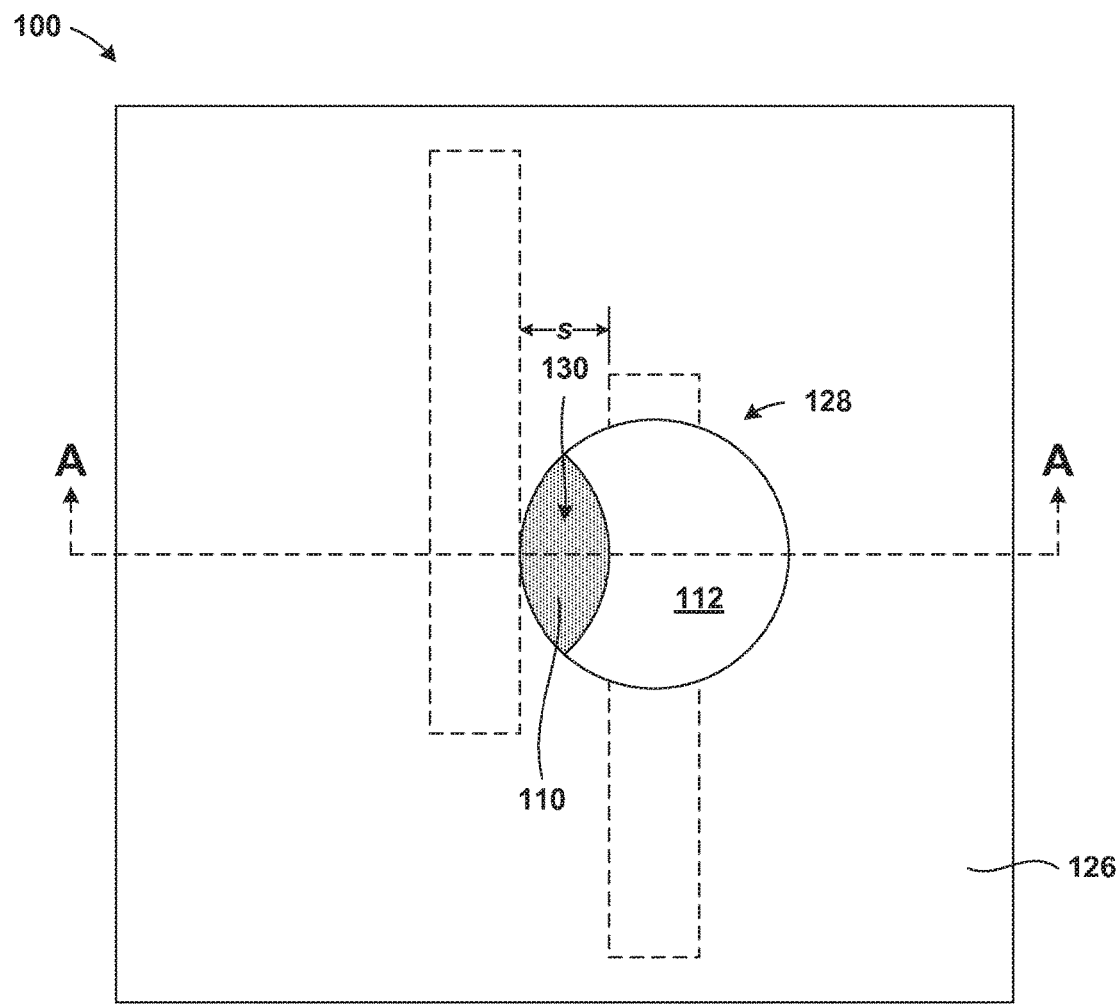
FIG. 6 is a top view of the structure and illustrates forming the second via pattern in the second ARC layer and the third planarization layer according to an exemplary embodiment.
Figure 6A:
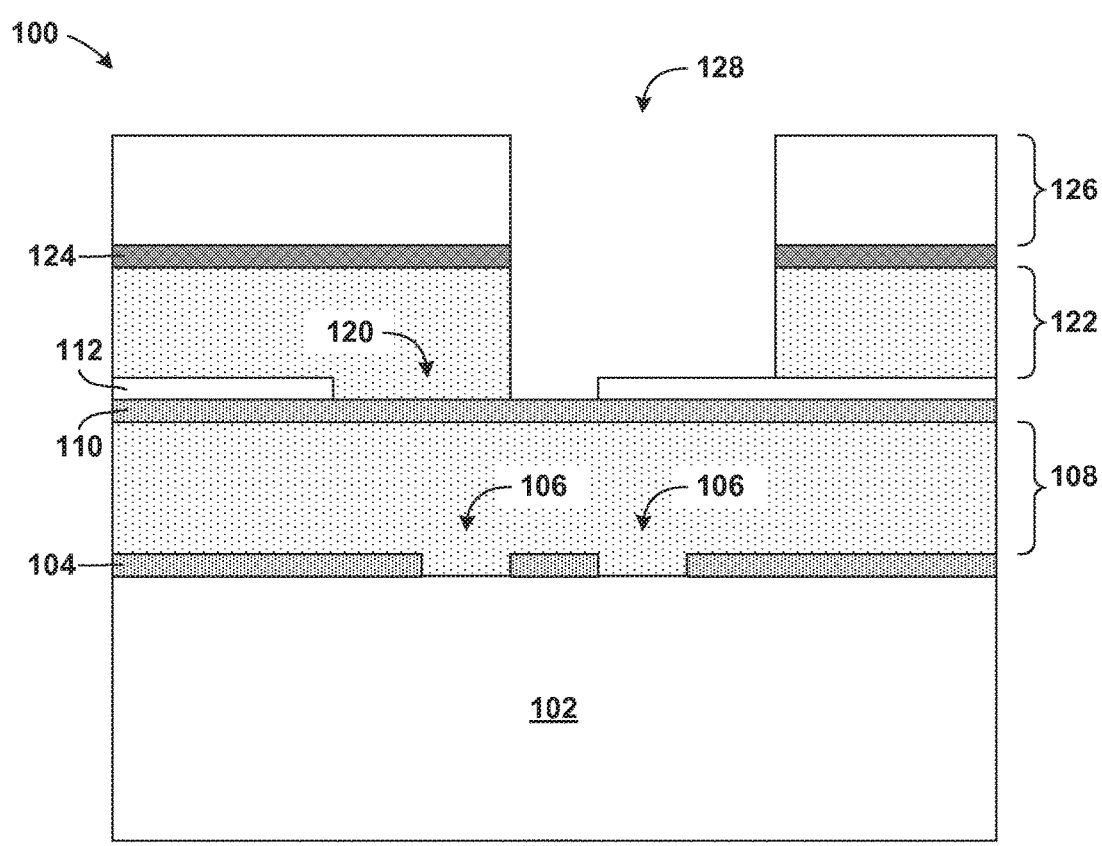
FIG. 6A is a cross section view of FIG. 6, taken along section line A-A.

FIGS. 6 and 6A are a demonstrative illustration of the structure during an intermediate step of a method of fabricating an e-fuse using a self-aligned via (SAV) process flow according to one embodiment. More specifically, the method can include a second stage of the double patterning technique in which a second via pattern 128 can be transferred into a third planarization layer 122 and a second anti-reflective coating layer 124 (hereinafter "ARC" layer). FIG. 6 illustrates the structure 100 from a top view. FIG. 6A is a cross section view of FIG. 6 taken along section line A-A. It should be noted that the second stage of the double patterning technique described below is substantially similar to the first stage described above with reference to patterning the first via pattern 120; however, the second stage can be applied to form a self-aligned via in an alternate location in accordance with known double patterning techniques.

The second via pattern 128 may be substantially similar to the first via pattern 120 (FIG. 4A) described above. In general, the second via pattern 128 may be positioned or aligned above a different trench feature of the trench pattern 106 than the trench feature to which the first via pattern 120 is aligned.

During this step, a second photo-resist layer 126 can be formed on top of the second ARC layer 124. The second photo-resist layer 126 may be substantially similar to the first photo-resist 118 (FIG. 4A) described above. The second photo-resist layer 126 can be lithographically exposed and developed to create the second via pattern 128. Like above, the second via pattern 128 can be formed by applying any appropriate photo-exposure method suitable to the type of photo-resist layer being used, as is well known in the art. Also like above, the second via pattern 128 can be transferred from the second photo-resist layer 126 into underlying layers, for example, the second ARC layer 124 and the third planarization layer 122.

The second via pattern 128 can be transferred into the second ARC layer 124 and the third planarization layer 122 according to the techniques described above with reference to transferring the first via pattern 120 (FIG. 4A) into the first ARC layer 116 (FIG. 4A) and the second planarization layer 114 (FIG. 4A).

Further, the second via pattern 128 may be positioned relative to the first via pattern 120 such that a portion of the second via pattern 128 overlaps a portion of the first via pattern 120. Stated differently, at least one via feature of the first via pattern 120 may overlap at least one via feature of the second via pattern 128. The overlap between the first and second via patterns 120, 128 may be referred to as an overlap region 130. As described above, the first and second via patterns 120, 128 may each be positioned or aligned above one of two adjacent trench features of the trench pattern 106. In the present embodiment, smaller via diameters may be preferable to produce a smaller overlap region 130. In such cases, a smaller overlap region 130 may ultimately improve e-fuse function by causing a conductive bridge to be subsequently formed, as discussed in detail below.

Figure 7:
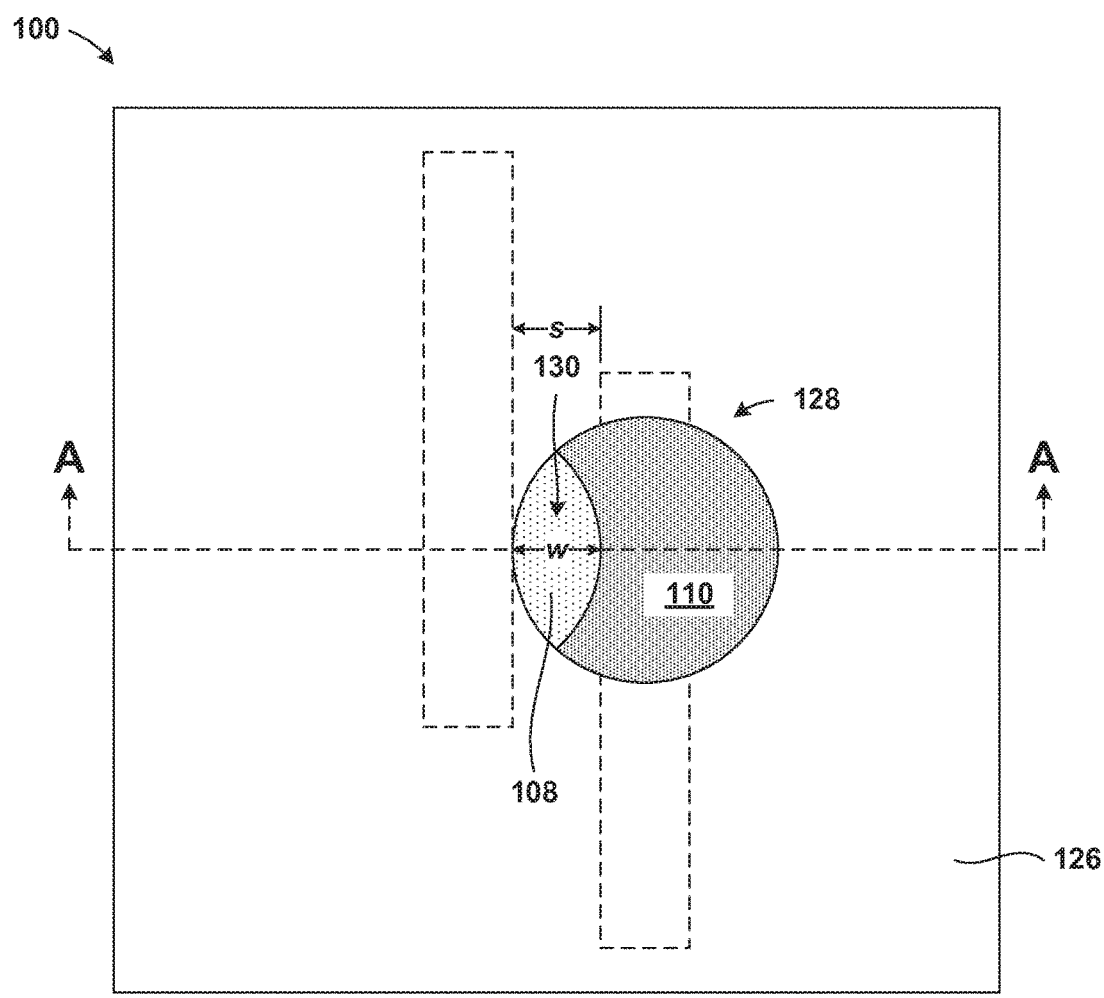
FIG. 7 is a top view of the structure and illustrates forming the second via pattern in the pattering layer according to an exemplary embodiment.
Figure 7A:
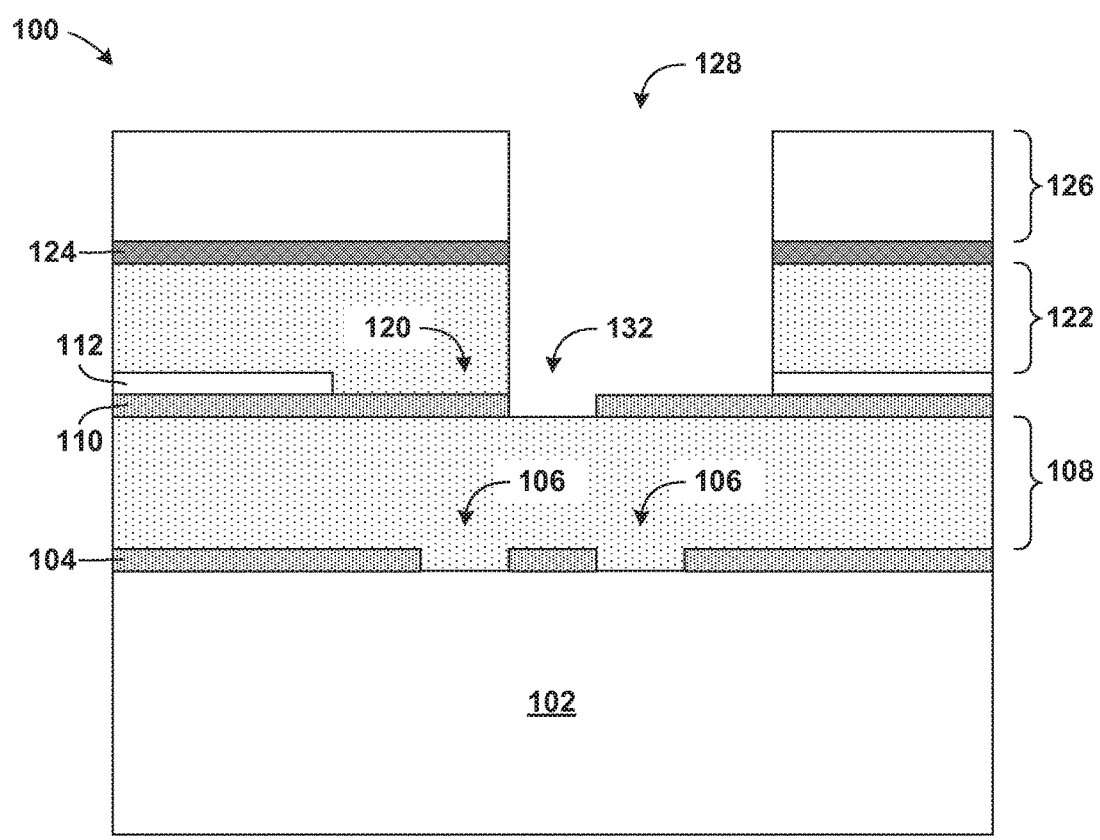
FIG. 7A is a cross section view of FIG. 7, taken along section line A-A.

FIGS. 7 and 7A are a demonstrative illustration of the structure during an intermediate step of a method of fabricating an e-fuse using a self-aligned via (SAV) process flow according to one embodiment. More specifically, the method can include a continuation of the second stage of the double patterning technique in which the second via pattern 128 can be transferred into the patterning layer 112. FIG. 7 illustrates the structure 100 from a top view. FIG. 7A is a cross section view of FIG. 7 taken along section line A-A.

After transferring the second via pattern 128 into the second ARC layer 124 and the third planarization layer 122, the second via pattern 128 can be transferred into the patterning layer 112. Transferring the second via pattern 128 in the present step can be performed according to the techniques described above with reference to transferring the first via pattern 120 (FIG. 4A) into the patterning layer 112 (FIG. 4A).

Specific to the second stage of the double patterning technique, and when transferring the second via pattern 128 into the patterning layer 112, an overlap pattern 132 is formed in the second hardmask layer 110 in the overlap region 130. The overlap pattern 132 may be formed in the second hardmask layer 110 due to the fact that the overlap region 130 is exposed to multiple etching techniques during multiple stages of fabrication. For example, a portion of the second hardmask layer 110, located in the overlap region 130, may be etched twice during the transferring of both the first and second via patterns 120, 128. As a result, some or all of a portion of the second hardmask layer 110 in the overlap region 130 may be removed and form the overlap pattern 132. Next, the third planarization layer 122 may be removed in a similar fashion as the second planarization 114 (FIG. 4A), as described above.

In addition, according to the present embodiment, the overlap pattern 132 may preferably extend from one of the adjacent trench features to the opposing adjacent trench feature in the same metal level, as illustrated in the figures.

Stated differently, the overlap pattern 132 may preferably have a width (w) equal to or greater than a space (s) between the two adjacent trench features of the trench pattern 106. It should be noted that an e-fuse may not be formed when the width (w) of the overlap pattern 132 is less than the space (s) between the two adjacent trench features of the trench pattern 106, as will be described in detail below.

Figure 8:
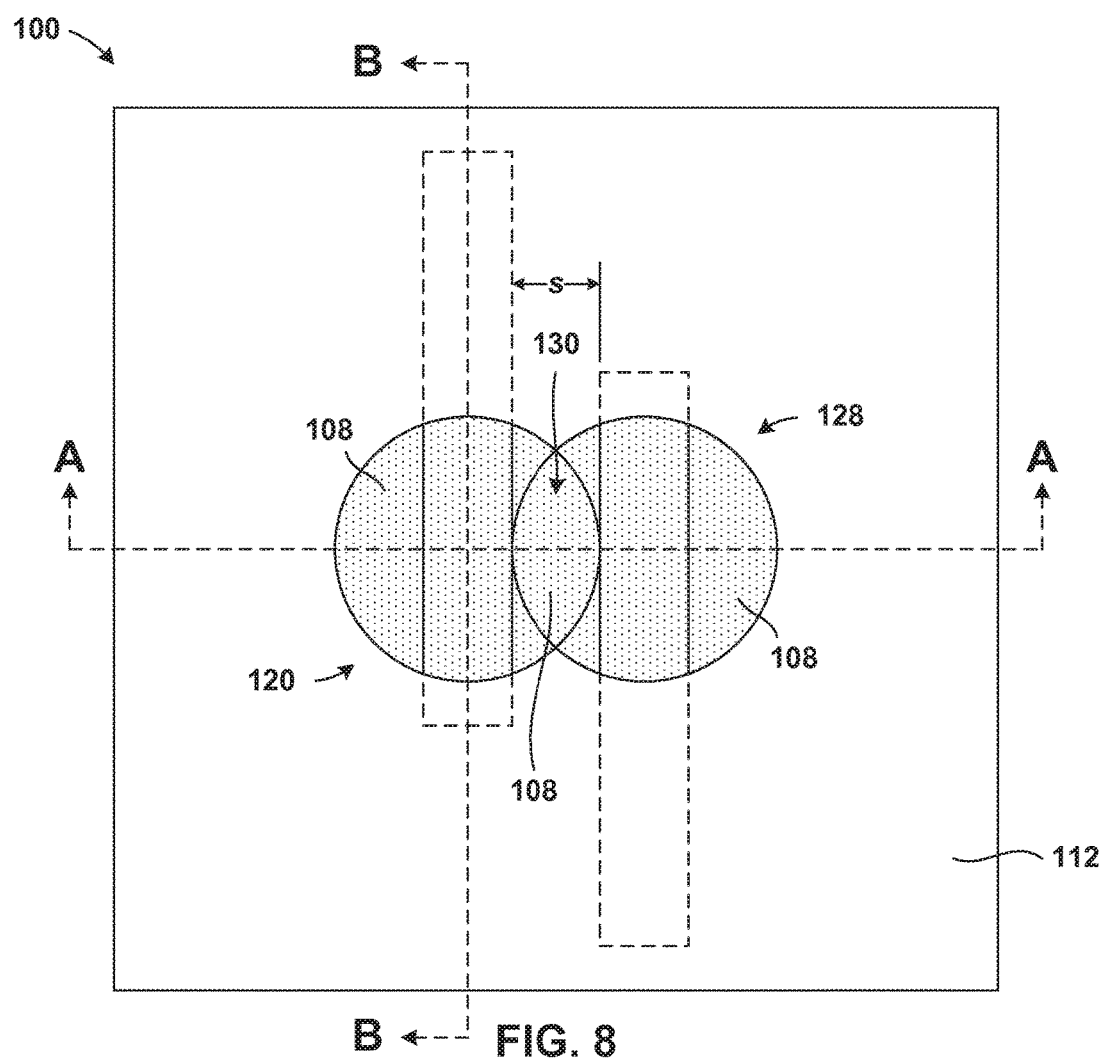
FIG. 8 is a top view of the structure and illustrates transferring the first and second via patterns from the patterning layer into the second hardmask layer according to an exemplary embodiment.
Figure 8A:
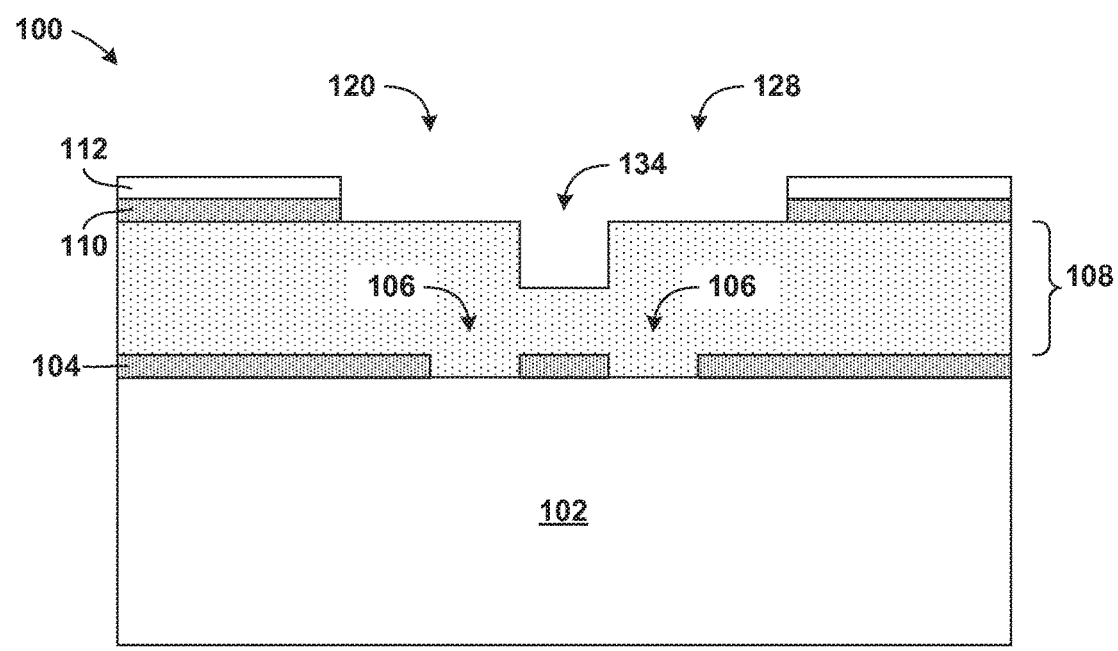
FIG. 8A is a cross section view of FIG. 8, taken along section line A-A.
Figure 8B:
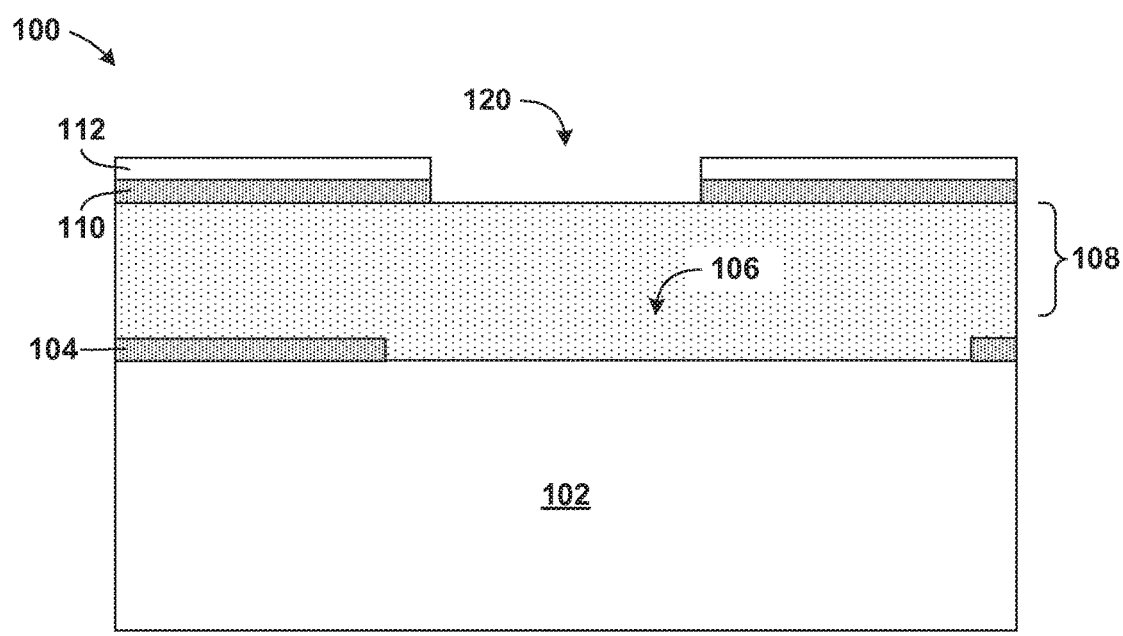
FIG. 8B is a cross section view of FIG. 8, taken along section line B-B.

FIGS. 8, 8A and 8B are a demonstrative illustration of the structure during an intermediate step of a method of fabricating an e-fuse using a self-aligned via (SAV) process flow according to one embodiment. More specifically, the method can include transferring the via patterns 120, 128 from the pattern layer 112 into the second hardmask layer 110. FIG. 8 illustrates the structure 100 from a top view. FIG. 8A is a cross section view of FIG. 8 taken along section line A-A. FIG. 8B is a cross section view of FIG. 8 taken along section line B-B.

After removing the third planarization layer 122 selective to the patterning layer 112 and the second hardmask layer 110, the first and second via patterns 120, 128 can then be transferred from the patterning layer 112 into the underlying layers, for example, the second hardmask layer 110. More specifically, a directional etching technique such as a reactive-ion-etching technique can be used to etch the second hardmask layer 110. In one embodiment, the second hardmask layer 110 can be etched with a reactive-ion-etching technique using a fluorocarbon plasma breakthrough step, followed by a chlorine based etchant. In the present step, the second patterning layer 112 can function as a mask and define the via patterns 120, 128. During transferring the via patterns 120, 128 from the patterning layer 112 into the second hardmask layer 110, a portion of the first planarization layer 108 may also be etched, and a recess 134 may form, as illustrated. The recess 134 may form in the overlap region 130 where a portion of the first planarization layer 108 would be exposed by the overlap pattern 132 (FIG. 7A) and etched during the etching of the second hardmask layer 110. It should be noted that the recess 134 may extend any depth into the first planarization layer 108, and in some cases, the recess 134 may extend to the first hardmask layer 104.

Figure 9:
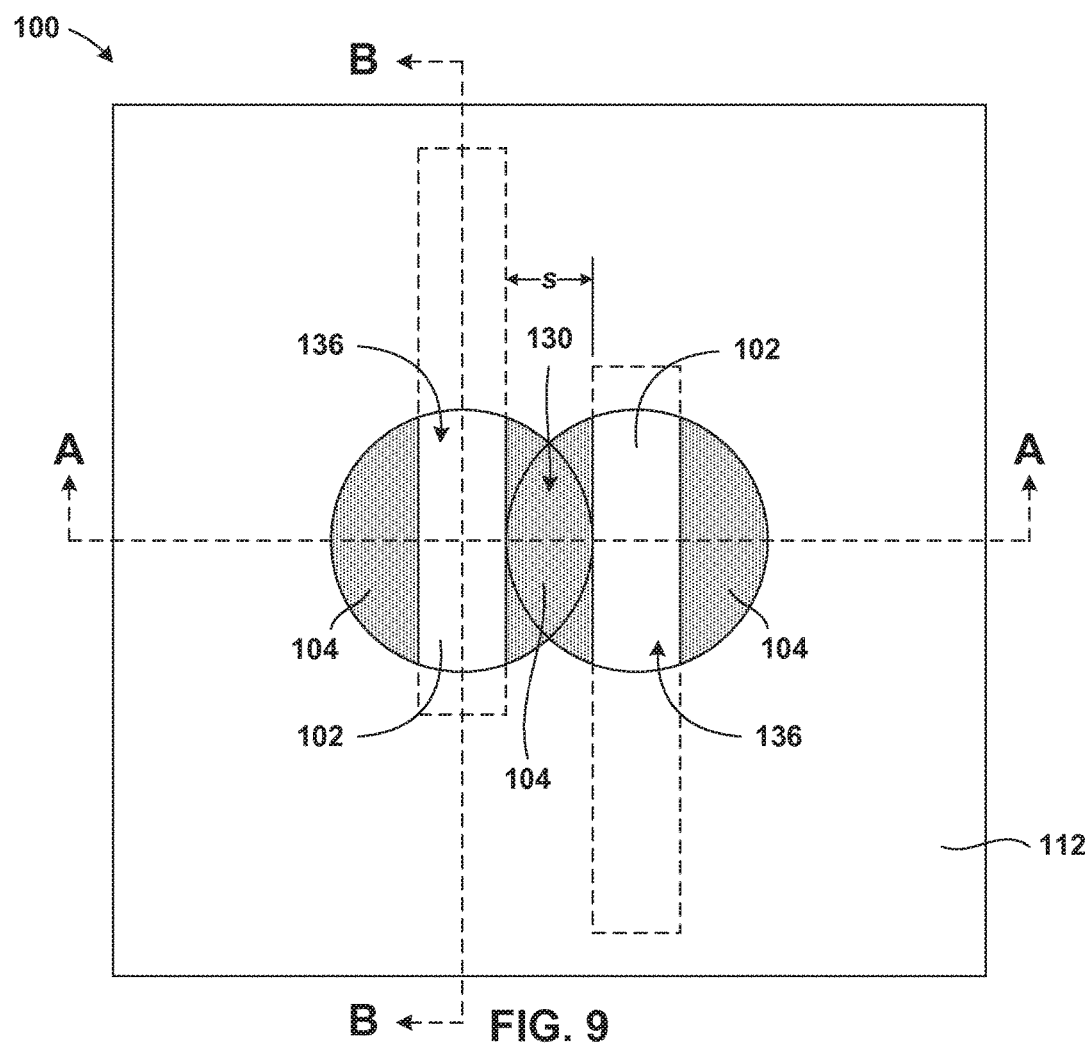
FIG. 9 is a top view of the structure and illustrates transferring the first and second via patterns from the second hardmask layer into an underlying substrate according to an exemplary embodiment.
Figure 9A:
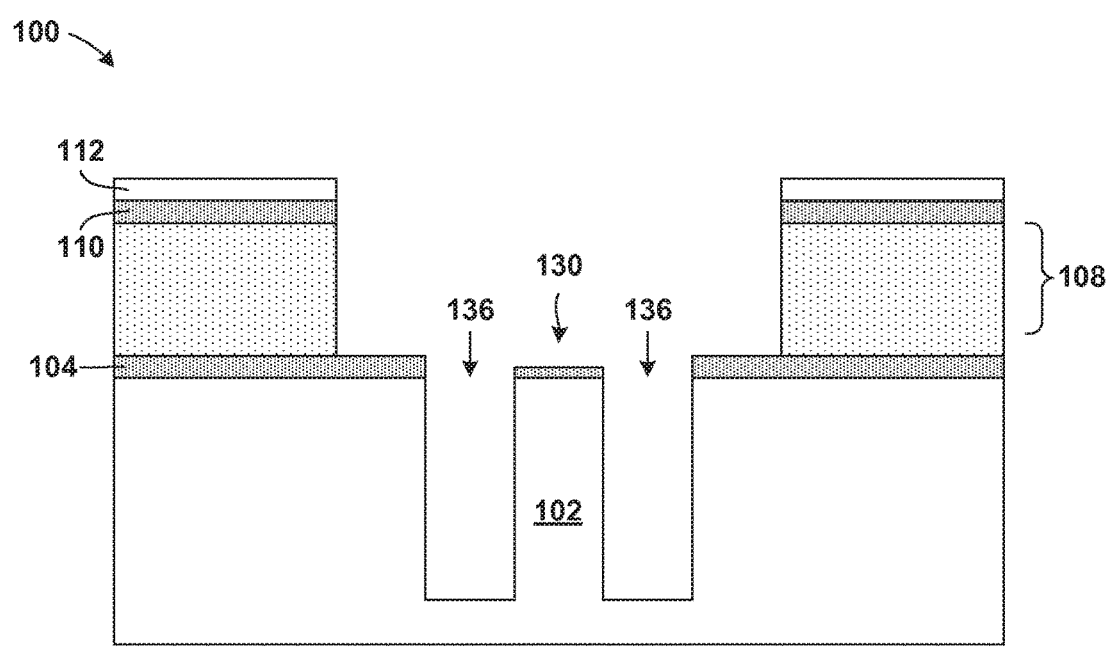
FIG. 9A is a cross section view of FIG. 9, taken along section line A-A.
Figure 9B:
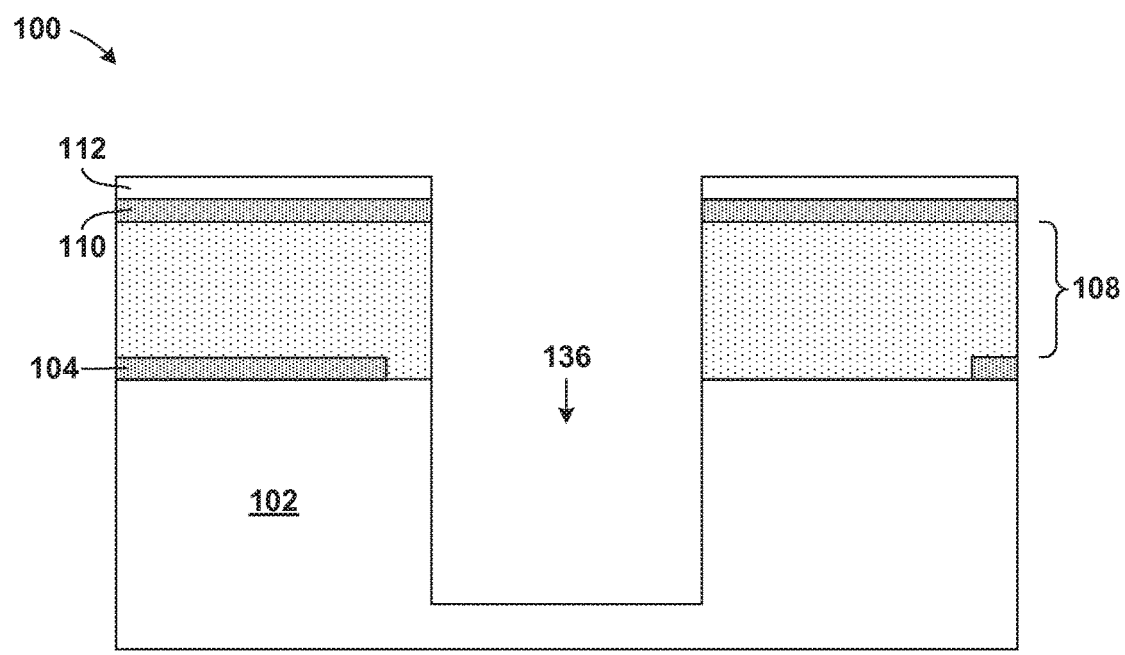
FIG. 9B is a cross section view of FIG. 9, taken along section line B-B.

FIGS. 9, 9A and 9B are a demonstrative illustration of the structure during an intermediate step of a method of fabricating an e-fuse using a self-aligned via (SAV) process flow according to one embodiment. More specifically, the method can include transferring the first and second via patterns 120, 128 (FIG. 8A) into the underlying substrate, and form at least two self-aligned via openings 136. FIG. 9 illustrates the structure 100 from a top view. FIG. 9A is a cross section view of FIG. 9 taken along section line A-A. FIG. 9B is a cross section view of FIG. 9 taken along section line B-B.

Transferring the via patterns 120, 128 (FIG. 8A) in the present step can be performed by etching the first planarization layer 108 and then etching the substrate 102 to a desired depth. The desired depth can depend on the ultimate function of the structure 100. A directional etching technique such as a reactive-ion-etching technique can be used to etch the first planarization layer 108 and the substrate 102. In one embodiment, the first planarization layer 108 and the substrate 102 can be etched with a reactive-ion-etching technique using a fluorocarbon based etchant. In the present step, the second hardmask layer 112 can function as a mask and define the via patterns 120, 128 (FIG. 8A), and the first hardmask layer 104 may function as a mask and define the trench pattern 106. The self-aligned via openings 136 may be self-aligned to the trench pattern 106 as defined by the first hardmask layer 104.

In the present embodiment, a portion of the first hardmask layer 104 located in the overlap region 130 may be thinned, or in some cases removed, as a result of etching the first planarization layer 108. The portion of the first hardmask layer 104 in the overlap region 130 may be thinned because the recess 134 (FIG. 8A) in the first planarization layer 108 may etch faster than the surrounding portions of the first planarization layer 108. As a result, the portion of the first hardmask layer 104 in the overlap region 130 would also etch faster.

Figure 10A:
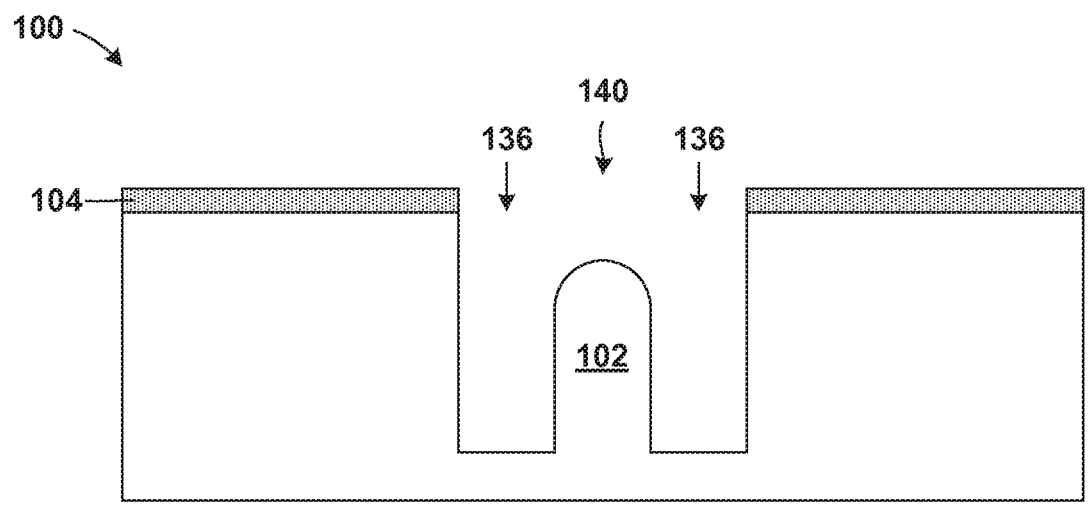
FIG. 10A is a cross section view of FIG. 10, taken along section line A-A.
Figure 10B:
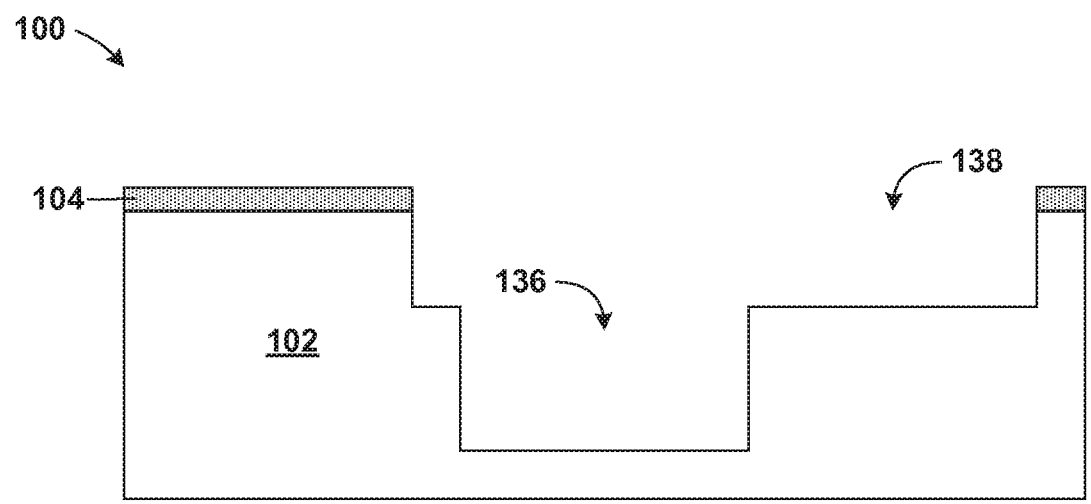
FIG. 10B is a cross section view of FIG. 10, taken along section line B-B.

FIGS. 10, 10A, and 10B are a demonstrative illustration of the structure during an intermediate step of a method of fabricating an e-fuse using a self-aligned via (SAV) process flow according to one embodiment. More specifically, the method can include transferring the trench pattern 106 from the first hardmask layer 104 into the underlying substrate 102 and form two trenches 138. FIG. 10 illustrates the structure 100 from a top view. FIG. 10A is a cross section view of FIG. 10 taken along section line A-A. FIG. 10B is a cross section view of FIG. 10 taken along section line B-B.

Transferring the trench pattern 106 in the present step can be performed by etching the substrate 102 to a desired depth. The desired depth can depend on the ultimate function of the structure 100. A directional etching technique such as a reactive-ion-etching technique can be used to etch the substrate 102. In one embodiment, the substrate 102 can be etched with a reactive-ion-etching technique using a fluorocarbon based etchant. In the present step, the first hardmask layer 104 can function as a mask, and define the trench pattern 106.

Because the portion of the first hardmask layer 104 in the overlap region 130 may have been previously thinned, that same portion may be removed entirely during the present etching step. As a result, a portion of the substrate 102 in the overlap region 130 may be removed, to form a bridge opening 140, as illustrated. It should be noted that the bridge opening 140 may not be formed if the portion of the first hardmask layer 104 in the overlap region 130 is not removed during transferring of the trench pattern 106 into the substrate 102. A depth of the bridge opening 140 may be less than a depth of the two trenches 138. Further, a bottom of the bridge opening 140 may have a concave shape causing the bridge opening 140 to be shallowest in the middle and deeper nearest to the two trenches 138. In some cases, the concave shape of the bottom of the bridge opening 140 may not be a smooth as illustrated in the figures, but rather, have a more pointed geometry having a well defined peak or point at or near the middle of the bridge opening 140.

Figure 11A:
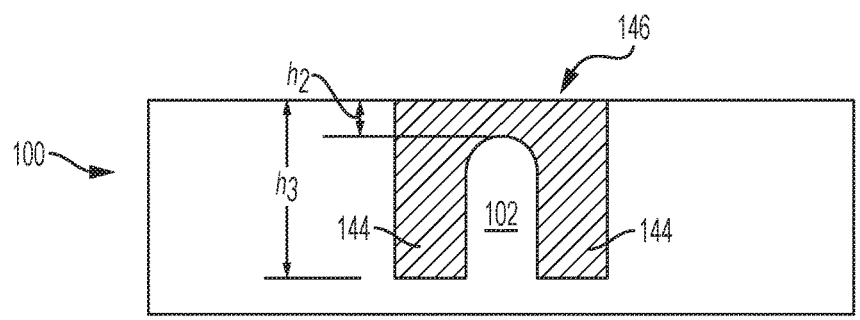
FIG. 11A is a cross section view of FIG. 11, taken along section line A-A.
Figure 11B:
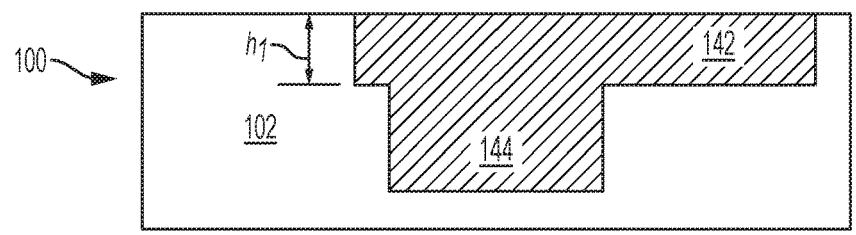
FIG. 11B is a cross section view of FIG. 11, taken along section line B-B.
Figure 11C:
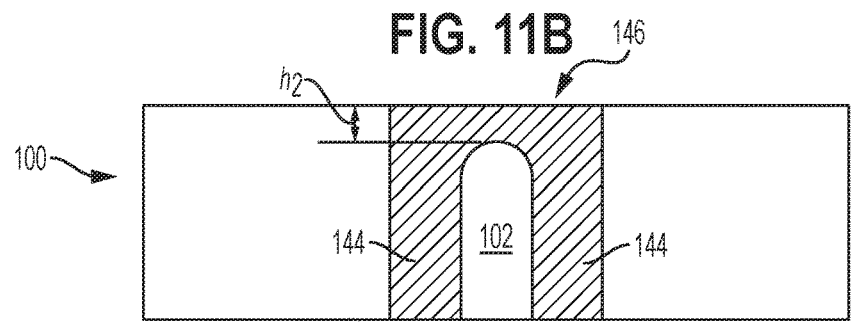
FIG. 11C is a cross section view of FIG. 11, taken along section line A-A according to a further embodiment.
Figure 11D:
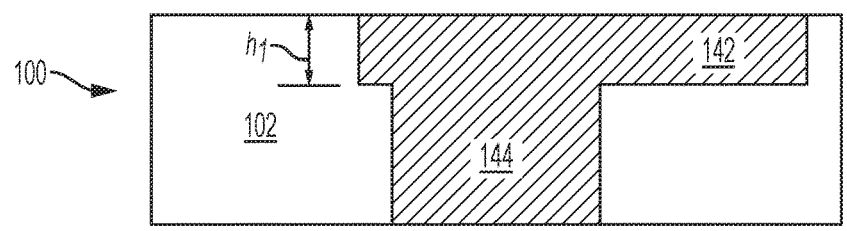
FIG. 11D is a cross section view of FIG. 11, taken along section line B-B according to a further embodiment.

FIGS. 11, 11A, and 11B are a demonstrative illustration of the final structure of a method of fabricating an e-fuse using a self-aligned via (SAY) process flow according to one embodiment, while FIGS. 11, 11C, and 11D are demonstrative illustrations of the final structure of a method of fabricating an e-fuse using a self-aligned via (SAV) process according to a further embodiment. More specifically, the method can include an e-fuse structure formed by filling the self-aligned via openings 136 and the two trenches 138 with a conductive interconnect material. FIG. 11 illustrates the structure 100 from a top view. FIG. 11A and FIG. 11C are cross section views of FIG. 11 taken along section line A-A. FIG. 11B and FIG. 11D are cross section views of FIG. 11 taken along section line B-B. In one embodiment, typical processing techniques known in the art can be used to fill the self-aligned via openings 136 (FIG. 10A) and the two trenches 138 (FIG. 10B) with a conductive interconnect material to form the e-fuse. In one embodiment, the conductive interconnect material may be formed using a filling technique such as electroplating, electroless plating, chemical vapor deposition, physical vapor deposition or a combination of methods. In one embodiment, the conductive interconnect material may include, for example, copper (Cu), aluminum (Al), or tungsten (W). The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

As is typical of most semiconductor interconnect structures, one or more barrier liners (not shown) may be first deposited before depositing the conductive interconnect material. In one embodiment the one or more barrier liners may include, for example, tantalum nitride (TaN), followed by an additional layer including tantalum (Ta). Other barrier liners may include cobalt (Co), or ruthenium (Ru) either alone or in combination with any other suitable liner.

The e-fuse of the present embodiment may include two metal lines 142, two self-aligned vias 144, and a conductive bridge 146. The conductive bridge 146 may form a conductive link between the two metal lines 142. In one embodiment, the two metal lines 142 may have a height ($h_1$) or vertical thickness ranging from about 40 nm to about 80 nm, and ranges there between, and the conductive bridge may have a height ($h_2$) or vertical thickness ranging from about 10 nm to about 30 nm, and ranges there between. In another embodiment, the two metal lines 142 may have a height ($h_1$) ranging from about 30 nm to about 70 nm, and ranges there between, and the conductive bridge may have a height ($h_2$) ranging from about 10 nm to about 15 nm, and ranges there between. In one embodiment, the conductive bridge may have a height ($h_2$) or vertical thickness approximately less than 40% of a height ($h_1$) or vertical thickness of the two metal lines 142. In another embodiment, the conductive bridge may have a height ($h_2$) approximately less than 25% of a height ($h_1$) of the two metal lines 142. The two self-aligned vias 144 may have a height ($h_3$) or vertical thickness greater than the height ($h_2$) of the two metal lines 142. In one embodiment, the two self-aligned vias 144 may have a height ($h_3$) ranging from about 100 nm to about 150 nm, although a height ($h_3$) less than 100 nm and greater than 150 nm, and ranges there between, may be acceptable. In one embodiment, the self-aligned vias 144 may not extend through an entire thickness of the substrate 102, as illustrated in FIG. 11A and FIG. 11B, and be electrically insulated from nearby interconnect structures (not shown). In another embodiment, as illustrated in FIG. 11C and FIG. 11D, one or both of the self-aligned vias 144 may extend through the entire thickness of the substrate 102, and form an electrical connection with a nearby interconnect structure (not shown).

The height ($h_2$) of the conductive bridge 146 may be directly related to the functionality of the e-fuse in that the reduced vertical thickness is specifically responsible for increased current density which contributes to the fail mechanism. For example, if the conductive bridge has a height greater than 30 nm, it may not experience the expected current density load to induce void formation and failure. In the present embodiment, a top surface of the conductive bridge 146 may be substantially flush with a top surface of the two metal lines 142.

It should be noted that an e-fuse may not form when the width (w) of the overlap pattern 132 is less than the space (s)

between the two adjacent trench features of the trench pattern 106 because the portion of the first hardmask layer 104 (FIG. 9A) in the overlap region 130 may not be removed, as described above, and the bridge opening 140 (FIG. 10A) may not be formed. Consequently, if the bridge opening 140 (FIG. 10A) is not formed, the conductive bridge 146 between the two metal lines 142 may not be formed, and thus an e-fuse may not be.

In one embodiment, a cap layer (not shown) may be deposited over the structure 100. The cap layer may electrically insulate the two metal lines 142, two self-aligned vias 144, and the conductive bridge 146 from additional interconnect levels (not shown) that may be subsequently formed above the current level illustrated. The cap layer may be deposited using typical deposition techniques, for example, chemical vapor deposition. The cap layer may include, for example, silicon nitride ($Si_3N_4$), silicon carbide (SiC), silicon carbon nitride (SiCN), hydrogenated silicon carbide (SiCH), or other known capping materials. The cap layer may have a thickness ranging from about 20 nm to about 60 nm and ranges there between, although a thickness less than 20 nm and greater than 60 nm may be acceptable.

Figure 12A:
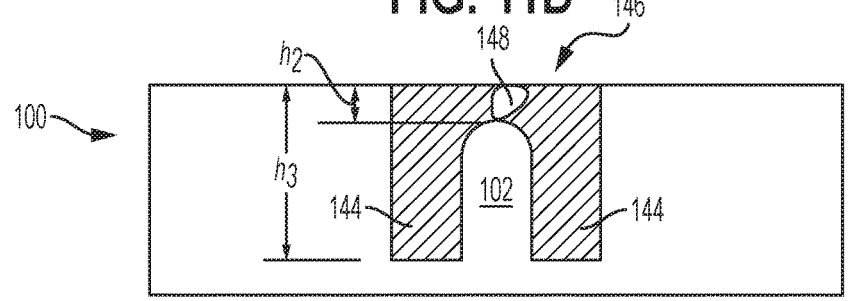
FIG. 12A is a cross section view of FIG. 11, taken along section line A-A, post programming.

FIG. 12A, is a demonstrative illustration of a final structure of a method of fabricating an e-fuse using a self-aligned via (SAV) process flow according to one embodiment. More specifically, FIG. 12A illustrates the final structure shown in FIG. 11A after programming. Like FIG. 11A, FIG. 12A is a cross section view of FIG. 11 taken along section line A-A.

In one embodiment, the conductive bridge 146 may have a height ($h_2$) or vertical thickness of about 13 nm. The relatively thin conductive bridge 146 may result in increased current density, and may be designed to be the fail point for the e-fuse. The intended failure mechanism of e-fuse of the present embodiment may include the formation of a void in the conductive bridge 146, for example a void 148. The void 148 would be expected to significantly increase the resistance of the conductive bridge 146. The void 148 may form as a result of uneven or poor liner coverage, and may propagate and grow larger due to the high current density. In general, typical principles of e-fuse electromigration failure mechanisms may apply to the e-fuse of the present embodiment.

Figure 13:
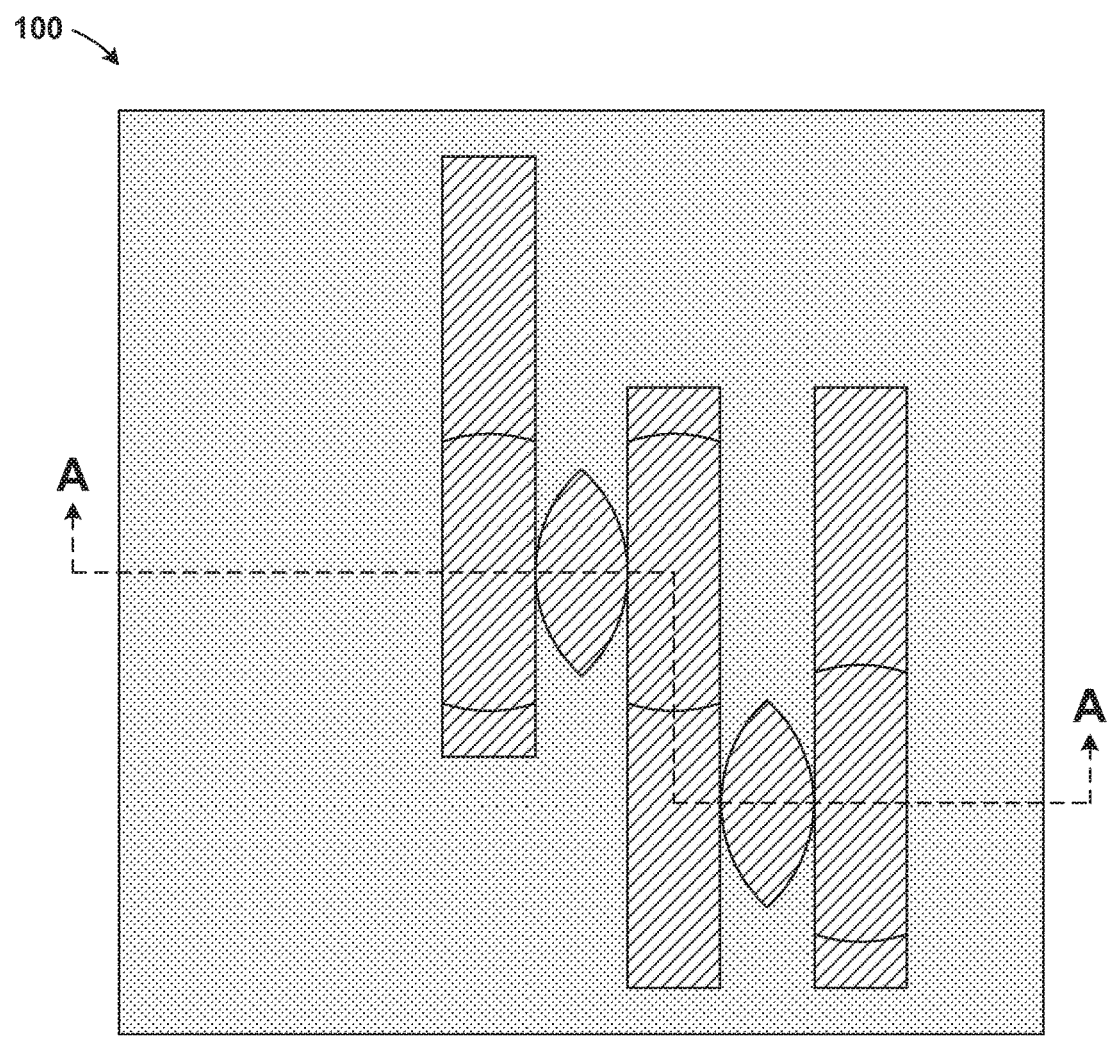
FIG. 13 is a top view of the structure and illustrates a final structure according to another exemplary embodiment.
Figure 13A:
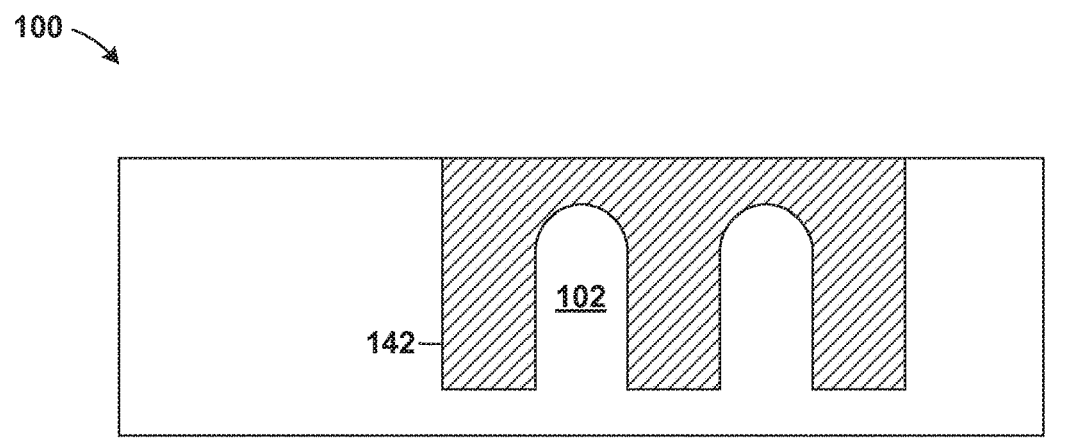
FIG. 13A is a cross section view of FIG. 13, taken along section line A-A.

FIGS. 13, 13A, are a demonstrative illustration of a final structure of a method of fabricating an e-fuse using a self-aligned via (SAV) process flow according to another embodiment. More specifically, the final structure may include multiple metal lines to form multiple e-fuses. In the present embodiment, one metal line may be shared to form two e-fuses. It is explicitly contemplated that any number of e-fuses may share any number of metal lines, in any configurations. As above, FIG. 13 illustrates the structure 100 from a top view and FIG. 13A is a cross section view of FIG. 13 taken along section line A-A.

Figure 14:
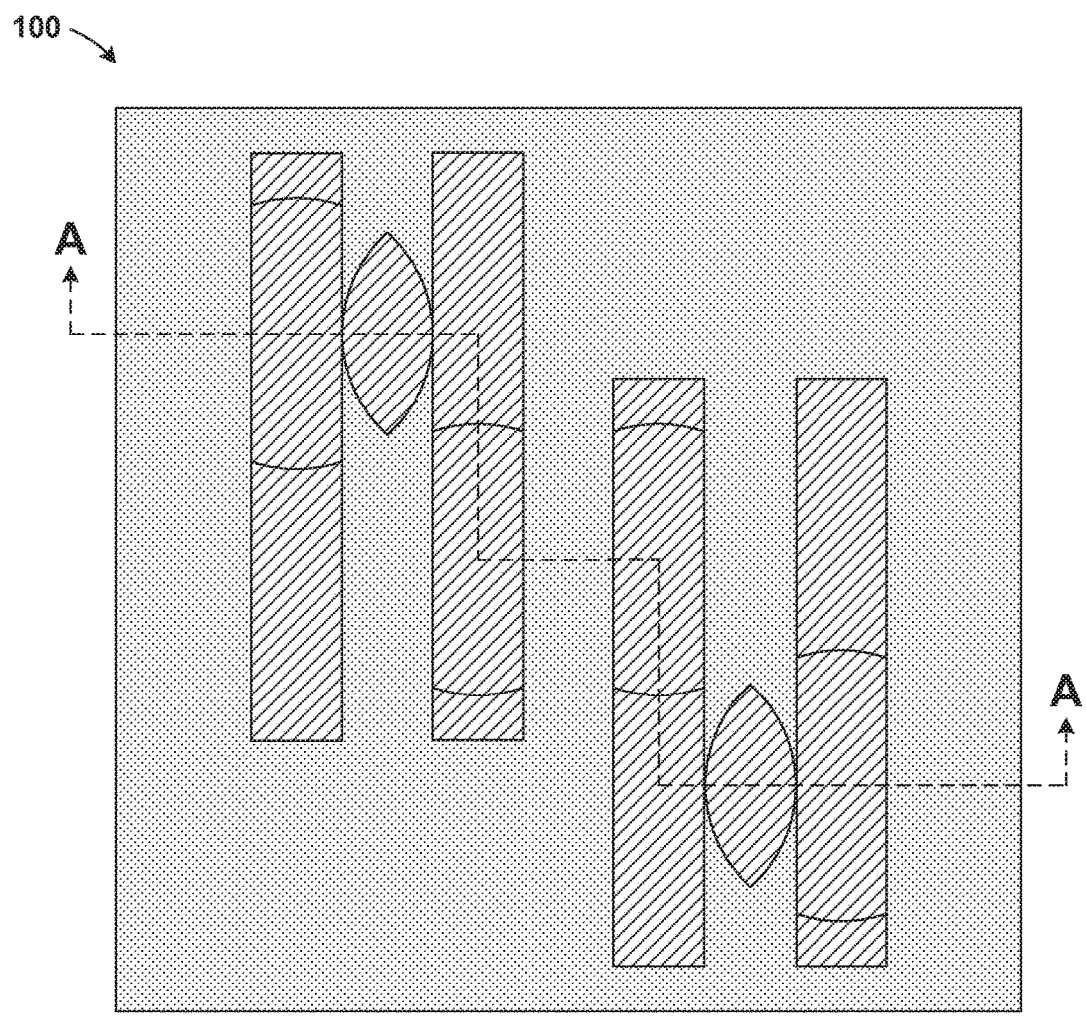
FIG. 14 is a top view of the structure and illustrates a final structure according to another exemplary embodiment.
Figure 14A:
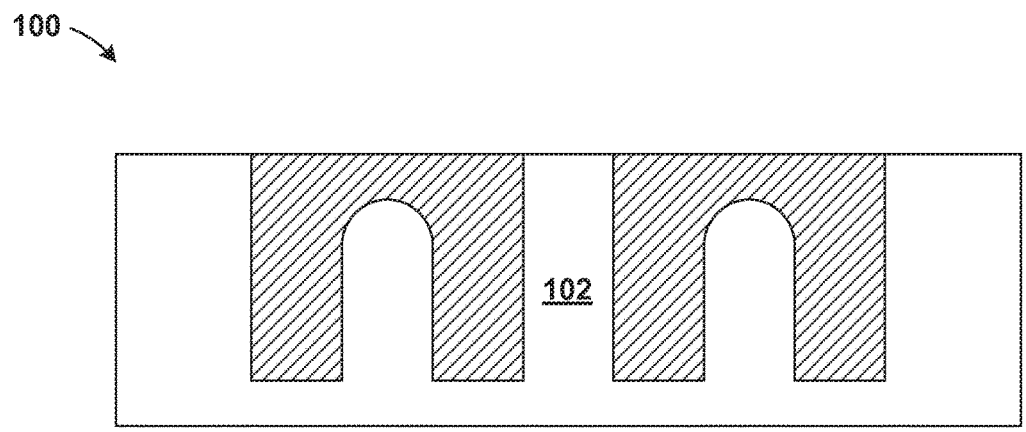
FIG. 14A is a cross section view of FIG. 14, taken along section line A-A.

FIGS. 14, 14A, are a demonstrative illustration of a final structure of a method of fabricating an e-fuse using a self-aligned via (SAV) process flow according to another embodiment. More specifically, the final structure may include multiple metal lines to form multiple e-fuses. In the present embodiment, two e-fuse structures are formed with four metal lines and two conductive bridges. As above, FIG. 14 illustrates the structure 100 from a top view and FIG. 14A is a cross section view of FIG. 14 taken along section line A-A.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed:

1. A structure comprising:
   a first metal line adjacent and parallel to a second metal line, the first and second metal lines each having a width, and a length greater than the width, and being in the same metal level within a substrate;
   a first via self-aligned to the first metal line;
   a second via self-aligned to the second metal line; and
   a conductive bridge extending laterally within the substrate from the first metal line to the second metal line, the conductive bridge is adjacent to both the first via and the second via, a vertical thickness of the conductive bridge is less than a vertical thickness of either the first metal line or the second metal line, and a bottom of the conductive bridge is concave, wherein the conductive bridge comprises a lenticular horizontal cross section.

2. The structure of claim 1, wherein a top surface of the conductive bridge is substantially flush with a top surface of the first and second metal lines.

3. The structure or claim 1, wherein the vertical thickness of the conductive bridge is shallowest midway between the first metal line and the second metal line.

4. The structure of claim 1, wherein a vertical thickness of a middle of the conductive bridge is less than a vertical thickness of a first end and a second end of the conductive bridge, the first and second ends of the conductive bridge contact the first and second metal lines, respectively.

5. The structure of claim 1, wherein the conductive bridge extends from an upper portion of the first metal line to an upper portion of the second metal line.

6. The structure of claim 1, further comprising:
   a void in the conductive bridge between the first metal line and the second metal line.

7. The structure of claim 1, wherein said conductive bridge has a height or vertical thickness that is approximately less than 40% of a height or vertical thickness of the two metal lines.

8. The structure of claim 1, wherein the first metal line, the second metal line, the first via, the second via and the conductive bridge are embedded within a substrate.

9. The structure of claim 8, wherein the substrate is a middle-of-the-line dielectric material.

10. The structure of claim 8, wherein said substrate is a gate material.

11. The structure of claim 8, wherein the substrate is a semiconductor material.

12. The structure of claim 8, wherein at least one of the self-aligned vias extends through an entire thickness of the substrate.

13. The structure of claim 1, wherein the first metal line, the second metal line and the conductive bridge are of unitary construction.

14. The structure of claim 13, wherein the first metal line, the second metal line and the conductive bridge are each comprised of a same conductive interconnect material.

15. The structure of claim 14, wherein a top surface of the conductive bridge is coplanar with a top surface of the substrate.

16. The structure of claim 15, wherein said conductive interconnect material further comprises a dopant, said dopant is selected from the group consisting of manganese, magnesium, copper, and aluminum.

17. The structure of claim 1, further comprising:
a third metal line adjacent and parallel to the second metal line, the third metal line having a width, and a length greater than the width, and the second and third metal lines being in the same metal level;
a third via self-aligned to the third metal line; and
a second conductive bridge extending from the second metal line to the third metal line, the conductive bridge is adjacent to both the second via and the third via, and a vertical thickness of the second conductive bridge is less than a vertical thickness of either the second metal line or the third metal line.

18. The structure of claim 17, wherein the second conductive bridge extends from a lengthwise edge of the second metal line to a lengthwise edge of the third metal line.

19. The structure of claim 1, wherein the conductive bridge extends from a lengthwise edge of the first metal line to a lengthwise edge of the second metal line.

20. The structure of claim 1, wherein the conductive bridge has a first width equal to or greater than a distance between the first and second metal lines, and a second width measured parallel to the first width less than the distance between the first and second metal lines.

\* \* \* \* \*